(12) United States Patent
Mieher et al.

(10) Patent No.: US 7,175,945 B2
(45) Date of Patent: Feb. 13, 2007

(54) FOCUS MASKING STRUCTURES, FOCUS PATTERNS AND MEASUREMENTS THEREOF

(75) Inventors: Walter Dean Mieher, Santa Clara, CA (US); Daniel Wack, Los Altos, CA (US); Ady Levy, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 11/084,556

(22) Filed: Mar. 16, 2005

(65) Prior Publication Data

US 2005/0208391 A1   Sep. 22, 2005

Related U.S. Application Data

(63) Continuation of application No. 10/291,181, filed on Nov. 7, 2002, now Pat. No. 6,884,552.

(60) Provisional application No. 60/338,204, filed on Nov. 9, 2001.

(51) Int. Cl.
*G03F 9/00* (2006.01)
*G03C 5/00* (2006.01)
*G01B 11/00* (2006.01)

(52) U.S. Cl. .................. 430/5; 430/30; 356/401; 382/145

(58) Field of Classification Search .............. 430/5, 430/30; 356/401; 382/145
See application file for complete search history.

(56) References Cited

U.S. PATENT DOCUMENTS

| | | |
|---|---|---|
| 4,757,207 A | 7/1988 | Chappelow et al. |
| 5,172,190 A | 12/1992 | Kaiser |
| 5,300,786 A | 4/1994 | Brunner et al. |
| 5,596,413 A | 1/1997 | Stanton et al. |
| 5,617,340 A | 4/1997 | Cresswell et al. |
| 5,661,546 A | 8/1997 | Taniguchi |
| 5,674,650 A | 10/1997 | Dirksen et al. |
| 5,757,507 A | 5/1998 | Ausschnitt et al. |
| 5,805,290 A | 9/1998 | Ausschnitt et al. |
| 5,856,049 A | 1/1999 | Lee |
| 5,936,738 A | 8/1999 | Liebmann et al. |
| 5,965,309 A | 10/1999 | Ausschnitt et al. |
| 5,976,740 A | 11/1999 | Ausschnitt et al. |
| 6,023,338 A | 2/2000 | Bareket |
| 6,079,256 A | 6/2000 | Bareket |
| 6,396,569 B2 | 5/2002 | Zheng et al. |
| 6,416,909 B1 | 7/2002 | Quek et al. |
| 6,420,075 B1 | 7/2002 | Okamoto |
| 6,462,818 B1 | 10/2002 | Bareket |
| 6,486,954 B1 | 11/2002 | Mieher et al. |
| 2002/0021434 A1 | 2/2002 | Nomura et al. |

FOREIGN PATENT DOCUMENTS

EP    0818814    1/1998

OTHER PUBLICATIONS

Nikoonahad et al., Patent Application Entitled "Overlay Error Detection", Filed Oct. 26, 2000 as U.S. Appl. No. 09/697,025.
Abdulhalim et al., Patent Application Entitled "Periodic Patterns and Technique to Control Misalignment between Two Layers", Filed Apr. 10, 2001 as U.S. Appl. No. 09/833,084.
Ghinovker et al., Patent Application Entitled "Overlay Marks, Methods of Overlay Mark Design and Methods of Overlay Measurements", Filed Jun. 27, 2001 as U.S. Appl. No. 09/894,987.
Nikoonahad et al., Patent Application Entitled "Metrology System Using Optical Phase", Filed Aug. 14, 2001 as U.S. Appl. No. 09/639,495.

*Primary Examiner*—Christopher G. Young
(74) *Attorney, Agent, or Firm*—Beyer Weaver & Thomas, LLP

(57) ABSTRACT

Methods and device structures used to determine the focus quality of a photolithographic pattern or a photolithographic system are disclosed. One aspect of the invention relates to focus masking structures configured to form focus patterns that contain focus information relating to the focus quality. The focus masking structures generally include a plurality of parallel source lines that are separated by alternating phase shift zones. Another aspect of the invention relates to focus patterns that change with changes in focus. The focus patterns generally include a plurality of periodic structures that form measurable shifts therebetween corresponding to the sign and magnitude of defocus. Another aspect of the invention relates to a method of determining the focus quality of a photolithographic pattern or a photolithographic system. The method generally includes: providing a focus masking structure, forming a focus pattern on a work piece with the focus masking structure, and obtaining focus information from the focus pattern. The focus information may be obtained using a variety of techniques, as for example, scatterometry techniques, scanning techniques, imaging techniques, phase based techniques, and the like.

4 Claims, 20 Drawing Sheets

FOCUS MASKING STRUCTURES, FOCUS PATTERNS AND MEASUREMENTS THEREOF

CROSS REFERENCE TO RELATED APPLICATION

This application is a continuation of prior application Ser. No. 10/291,181 filed Nov. 7, 2002, now U.S. Pat. No. 6,884,552 which claims priority of U.S. Provisional No. 60/338,204 filed on Nov. 9, 2001, which is hereby incorporated by reference.

BACKGROUND OF THE INVENTION

The present invention relates generally to photolithography methods and systems, and more specifically to improved techniques for determining focus error.

Integrated circuits are made by photolithographic processes, which use photolithographic masks and an associate light or radiation source to project a circuit image onto a wafer. Referring to FIG. 1, for example, a simplified diagram of a lithography system 2 is shown. By way example, the lithography system may correspond to a stepper or scanning system. The lithography system 1 typically includes a light or radiation source 3 and a first set of optics 4 that illuminate a mask 5 having a circuit pattern 6 disposed thereon. In order to form the circuit pattern, the mask 6 may include opaque portions and/or transmissive portions. As generally well known, the opaque portions block the light from pass through the mask 6 while the transmissive portions allow the light to pass therethrough. In some cases, the transmissive portions may constitute phase shifted areas. Phase shifted areas tend to alter the phase of the light or radiation passing through the mask. The lithography system 2 also includes a second set of optics 7 that pick up the transmitted light or radiation and focuses (or images) it onto a surface 9 of a semiconductor wafer 8 thus writing the pattern of the mask 6 onto the surface 9 of the semiconductor wafer 8. In most cases, the semiconductor wafer 8 includes a layer of photoresist that when exposed to the patterned light or radiation forms the pattern of the mask onto the wafer.

One problem that has been encountered during lithographic processes is the misfocus found between the surface of the wafer being patterned on and the ideal focus plane. Referring back to FIG. 1, the light or radiation follows an optical path that corresponds to the Z axis. The first and second set of optics as well as the mask and the wafer are thus positioned orthogonal to the optical path in different X&Y planes. With this in mind, the second set of optics generally focuses the light on a specific X&Y plane (not shown) positioned along the Z axis. This plane is generally referred to as the ideal focus plane. When the system is in focus, the ideal focus plane generally coincides with the surface of the wafer. When the system is out of focus, the ideal focus plane is offset relative to the surface of the wafer. That is, there is Z axis displacement between the ideal focus plane and the surface of the wafer being written on and thus there is misfocus. As should be appreciated, misfocus generally has a sign and magnitude corresponding to the Z axis displacement. The sign corresponds to the direction of the displacement (e.g., positive or negative), and the magnitude corresponds to the amount of displacement (e.g., the actual distance between planes). The displacement may be caused by many factors. For example, the second set of optics and/or the wafer may be mis-aligned (e.g., tilted) or they may be positioned in the wrong plane along the Z axis.

Unfortunately, misfocus may adversely effect the printed pattern on the wafer. For example, misfocus may cause increases or decreases in the width of the lines printed on the wafer, i.e., linewidth is a function of focus. The linewidth generally determines the speed and the timing across the circuit and thus misfocus may cause one portion of the chip to run faster or slower than another portion of the chip. In most cases, the chip is clocked to the slowest portion thereby reducing the selling price of the chip. In addition, misfocus may cause open or shorted circuits such that the chip must be discarded or reworked. Presently, focus is determined by exposing a pattern through a range of focus settings, and then inspecting the resultant patterns for the best looking images or by using an aerial image monitor to determine the spatial location of the best focus.

In view of the foregoing, there is a desire for improved techniques for determining focus error, as for example, the direction (i.e., the positive or negative Z-axis translation of the wafer) and the magnitude (i.e., offset displacement) of misfocus.

SUMMARY OF THE INVENTION

The invention relates, in one embodiment, to a focus masking structure used to determine the focus quality of a photolithographic pattern or a photolithographic system. The focus masking structure is generally disposed on a substrate. The focus masking structure includes a plurality of parallel source lines. The focus masking structure also includes a plurality of phase shift zones configured to separate the plurality of parallel source lines. The plurality of phase shift zones alternate between a first phase shift zone and a second phase shift zone. In one implementation, the first and second phase shift zones have phases that are not equal to the phase of the substrate, and a phase difference therebetween that is not equal to 0 or 180 degrees or integer multiples of 180 degrees. Furthermore, the plurality of parallel source lines and phase shift zones cooperate to produce a focus pattern that includes at least two periodic structures that shift relative to one another with changes to focus. In most cases, the shifts are based o the sign and magnitude of defocus.

The invention relates, in another embodiment, to a focus pattern used to determine the focus quality of a photolithographic pattern or a photolithographic system. The focus pattern in generally disposed on a surface of workpiece such as a wafer. The focus pattern is generally produced by a focus masking structure. The focus pattern includes a first periodic structure having a plurality of parallel first printed lines. Each of the first printed lines are formed by a first phase transition of a the focus masking structure. The focus pattern also includes a second periodic structure having a plurality of parallel second printed lines. Each of the second printed lines are formed by a second phase transition of the focus masking structure. The second phase transition is different than the first phase transition. Furthermore, the first and second periodic structures form measurable shifts therebetween that correspond to system defocus. In most cases, the measurable shifts are based on the sign and magnitude of defocus.

The invention relates, in another embodiment, to a method of determining the focus quality of a photolithographic pattern or a photolithographic system. The method includes providing a focus masking structure configured to produce a focus pattern. The focus masking structure generally includes a plurality of source lines that are separated by alternating phase shift zones. The method further includes forming a focus pattern on a work piece with the focus masking structure. The focus pattern generally includes a plurality of periodic structures that form measurable shifts therebetween corresponding to the sign magnitude of defocus. The method also includes obtaining focus information from the focus pattern. The focus information is based at least in part on the measurable shifts between the plurality of periodic structures.

BRIEF DESCRIPTION OF THE DRAWINGS

The present invention is illustrated by way of example, and not by way of limitation.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

Figure 1:
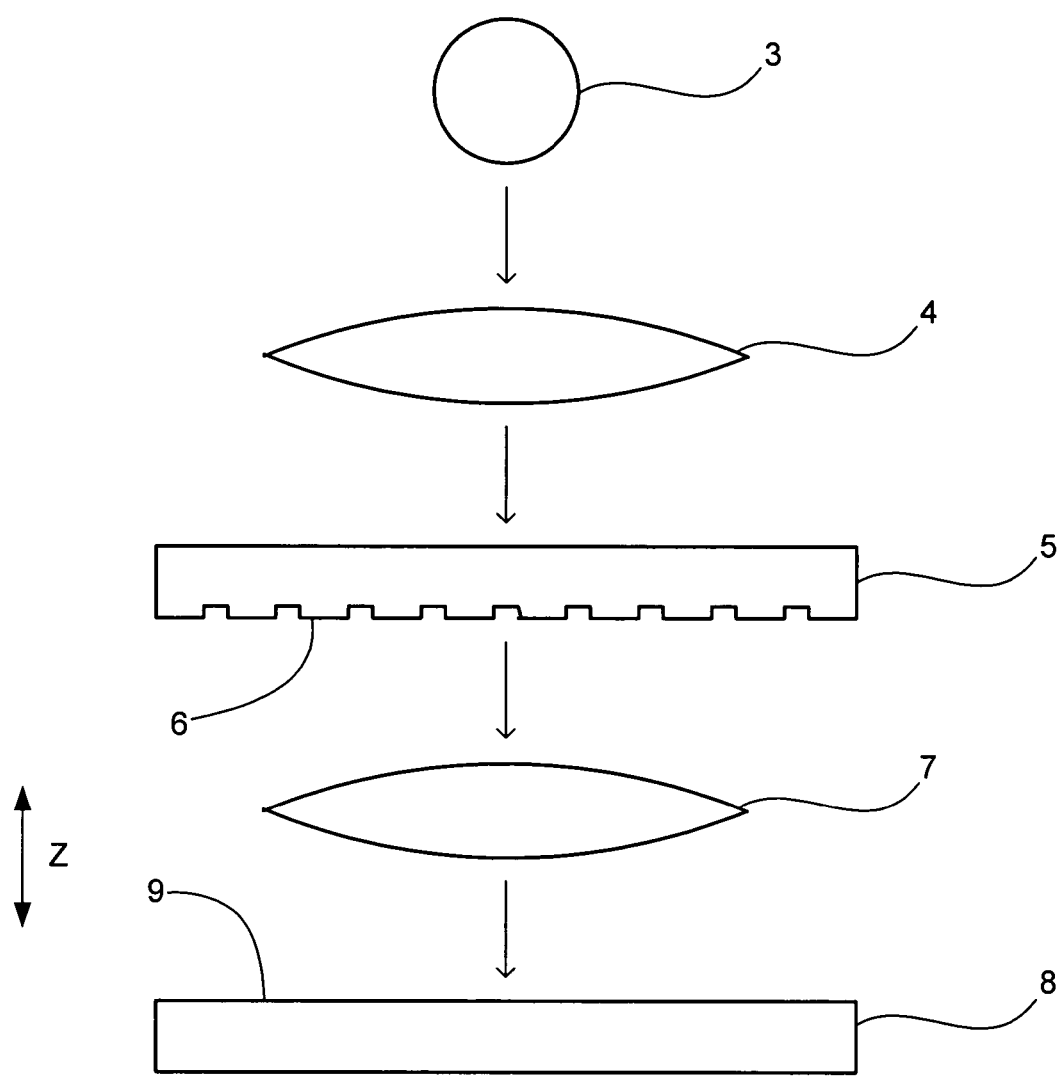
FIG. 1 is a simplified example of a lithography system.
Figure 2:
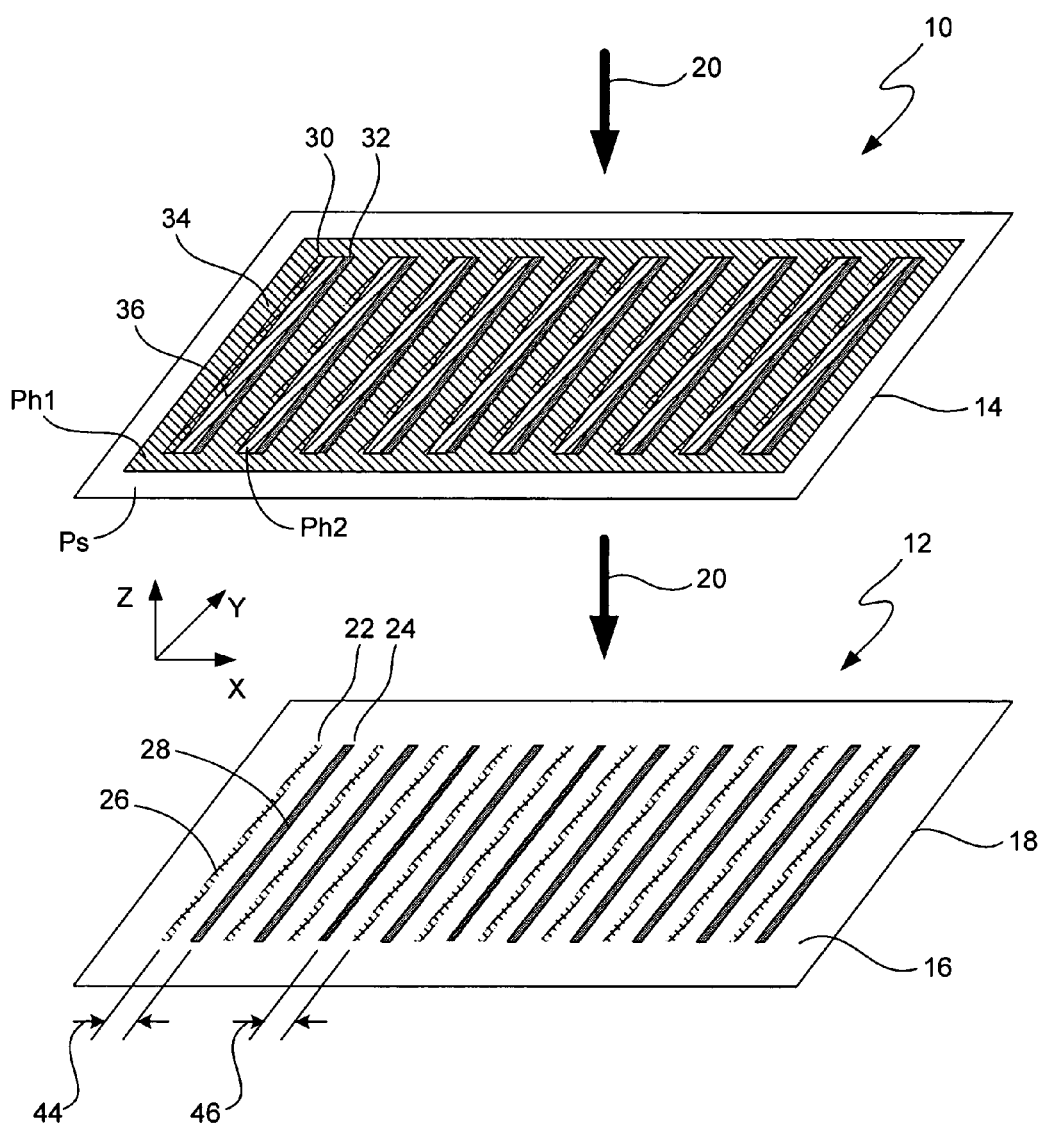
FIG. 2 is a simplified perspective view of a focus masking structure and a focus pattern, in accordance with one embodiment of the present invention.

FIG. 2 is a simplified perspective view of a focus masking structure 10, in accordance with one embodiment of the present invention. The focus masking structure 10 is generally provided to produce a focus pattern 12 corresponding to the focus quality of a photolithographic pattern or a photolithographic system. The focus pattern 12 may be used to improve the focus control of subsequent lithographic patterning and to determine whether the quality of the photolithographic pattern meets specified requirements. The focus masking structure 10 may be suitable for a wide variety of photolithography processes, as for example, photolithographic processes pertaining to semiconductor manufacturing, optical device manufacturing, micro-mechanical device manufacturing, magnetic recording data storage manufacturing and the like.

Although not shown, one or more of the focus masking structures 10 may be positioned on a photolithographic mask. In one embodiment, the focus masking structure is positioned on a product mask configured for producing a circuit pattern on a wafer. In this embodiment, the focus masking structure is generally positioned in a region of the product mask that is not used by a circuit pattern. For example, the focus masking structure may be positioned in a region that corresponds to the area of the wafer used for sawing (e.g., saw street). Any number of focus masking structures may be positioned on the product mask. Generally speaking, about 1 to about 10 focus masking structures may be used for focus monitoring on a mask used for a product. In another embodiment, the focus masking structure is positioned on a test mask for producing test patterns on a wafer. A test mask is generally used for testing the lithography equipment rather than for generating a product. Any number of focus masking structures may be positioned on a test mask. For example, 1000's of focus masking structures may be used on the test mask.

In general, the focus masking structure 10, which is located on a substrate 14, is used to project the focus pattern 12 onto a surface 16 of a workpiece 18. In most cases, the focus pattern 12 is printed on the surface 16 of the workpiece 18 when light or radiation 20 is made to travel through the focus masking structure 10. By way of example, the surface 16 may include a layer of photoresist for capturing the image produced by the focus masking structure 10 when light 20 is passed therethrough. That is, the light or radiation induces chemical and physical changes in the photoresist that can be developed into a structural pattern.

The focus masking structure 10 is generally configured to produce a focus pattern 12 that changes with changes in focus. In general, the focus masking structure 10 transforms actual focus information in the Z-direction into measurable focus information in a direction orthogonal to the Z-axis, as for example, in the X and/or Y directions. For example, the measurable focus information is contained in the focus pattern 12, which is positioned in an X & Y plane. In one embodiment, the focus masking structure 10 is configured to produce a focus pattern 12 having multiple structures that form measurable shifts therebetween corresponding to system defocus. That is, the focus masking structure 10 creates patterns having positions that are sensitive to focus. For example, the focus masking structure 10 may produce a focus pattern 12 having a plurality of periodic structures formed by parallel printed lines that shift when the system is out of focus. Periodic structures increase the amount of information that may be used to determine focus. Periodic structures may be widely modified to diminish the impact of certain processes on the focus measurements. For example, the size and pitch of the printed lines may be arranged to coincide with the size of the lines of the circuit pattern so that the structures are more correlated with what is happening to the circuit pattern during processing.

Figure 7:
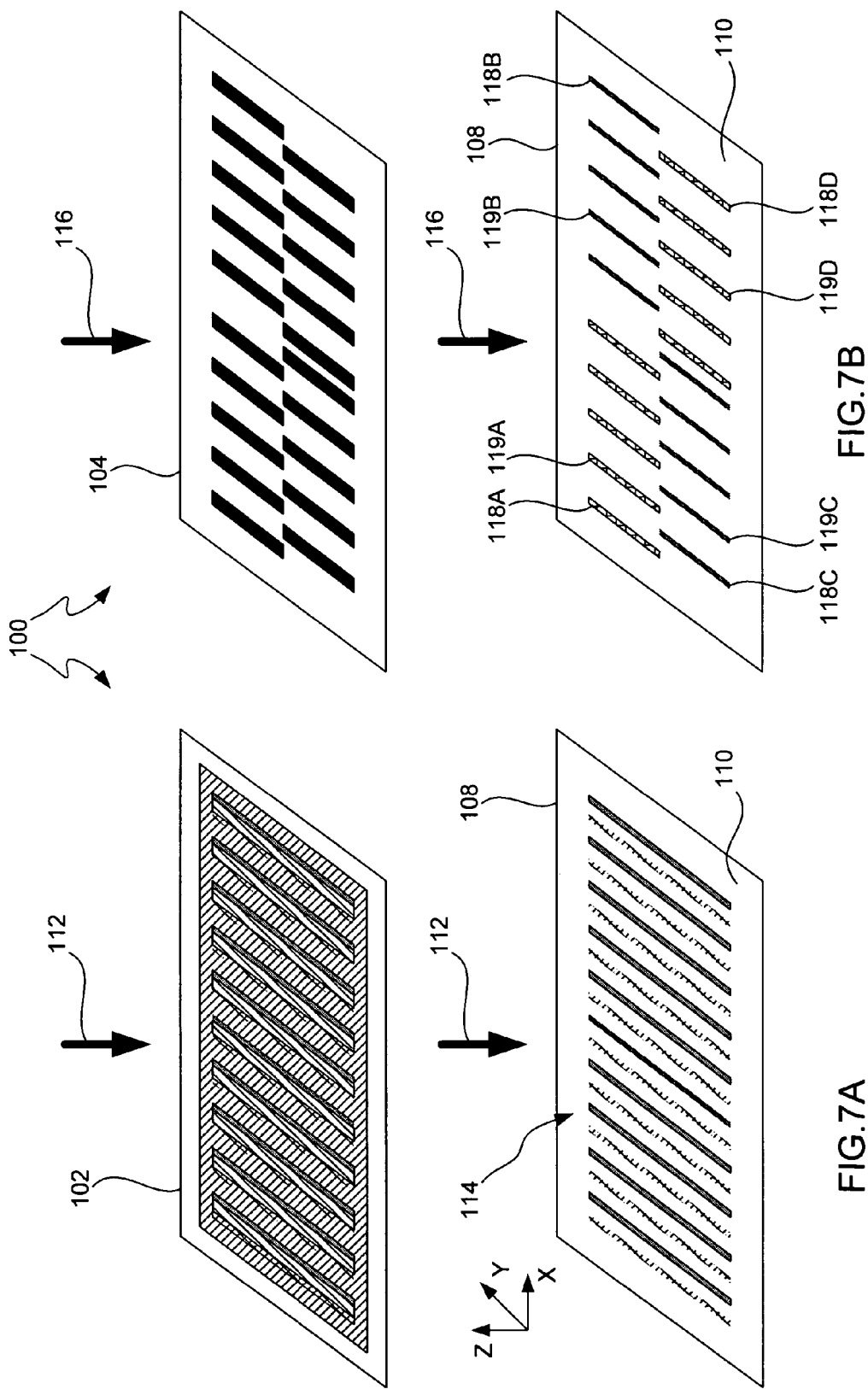
FIGS. 7A and 7B are perspective views of a focus masking system, in accordance with one embodiment of the invention.

In one implementation, the periodic structures of the focus pattern are interposed or interlaced with one another such that their parallel lines alternate from one to the other along the same axis. For example, as shown in FIG. 2 a first periodic structure 22, which includes a plurality of parallel lines 26 (shown by cross hatching), is interlaced with a second periodic structure 24, which includes a plurality of parallel lines 28 (shown by shading). In another implementation, the periodic structures of the focus pattern are spatially distinct relative to one another. For example, as shown in FIG. 7B, all of the periodic structures 118 are separated from one another rather than being interlaced therewith. In yet another implementation, the periodic structure of the focus pattern may be a combination of the two implementations above. That is, a first portion of the periodic structures may be interposed or interlaced while a second portion is spatially separated (see FIGS. 12 and 13). In any of the implementations, the periodic structures of the focus pattern shift relative to one another when the system is out of focus. In most cases, the periodic structures are arranged to shift both positively and negatively in the X direction when the system is out of focus.

The shifting periodic structures 22, 24 are produced by a focus masking structure 10 that includes a plurality of source lines 30 (shown by cross hatching) and 32 (shown by shading) that are separated by alternating phase shift zones 34 and 36. As should be appreciated, source lines 30 generally correspond to the printed lines 26 of periodic structure 22 and source lines 32 generally correspond to the printed lines 28 of periodic structure 24. In one embodiment, the phase shift zones 34, 36 are configured to adjust the placement of the periodic structures 22, 24 and thus the lines 26, 28 in accordance with the sign and magnitude of the focus. This is generally accomplished by using different phases, Ph1 and Ph2, respectively, that are not equal to the phase Phs of the substrate 14. If there is a phase difference (e.g., phase difference not equal to an integer multiple of 180), the position of the dark/bright zones shift left or right in accordance with focus. In one implementation, the substrate 14 represents a non-phase shifted area and the phase shift zones 34 and 36 represent first and second phase shifted areas. Alternatively, one of the phases Ph1 or Ph2 may be equal to the phase Phs of the substrate.

In addition, the alternating phase shift zones 34 and 36 are constructed so that the phase difference (Ph1−Ph2) therebetween is not 0 or 180 degrees or integer multiples of 180 degrees. It has been found that if (Ph1−Ph2) does not equal 0 or 180 then the position of periodic structures 22 and 24 shift as a function of focus, i.e., the positions of lines 26 and 28 change with changes in focus. Conversely, if the phase difference (Ph1−Ph2) equals 0 or 180 then the position of periodic structures 22 and 24 are not a function of focus, i.e., the positions of lines 26 and 28 do not change with changes in focus. Alternatively, When projected onto the surface 16 of the workpiece 18, the quality of focus may be determined by comparing the relative positions of the periodic structures 22, 24. For instance, the position of the first periodic structure 22 may be compared with the position of second periodic structure 24 in the X direction to determine the focus in the Z direction. In general, the periodic structures are configured to shift in opposite directions. For example, the first periodic structure may shift in the positive X direction and the second periodic structure may shift in the negative X direction (or vice versa) thus producing a displacement that corresponds to misfocus. The shift displacement (e.g., the distance the structures shifted) may relate to the magnitude of misfocus and the shift direction (e.g., the direction the structures shifted) may relate to the sign of misfocus.

In one embodiment, the spacings between the lines of the shifting structures are used to determine focus errors. Referring to the focus pattern 12, adjacent lines 26 and 28 of periodic structures 22, 24 form a first spacing 44 (from lines 26 to 28) and a second spacing 46 (from lines 28 to 26) therebetween. These spacings change as a function of focus. That is, the spacings 44, 46 change when the periodic structures 22, 24 shift in opposite directions in accordance with defocus. The change in spacings 44 and 46 are generally inverse to one another. That is, as spacing 44 gets larger, spacing 46 gets correspondingly smaller (or vice versa).

Figure 3A:
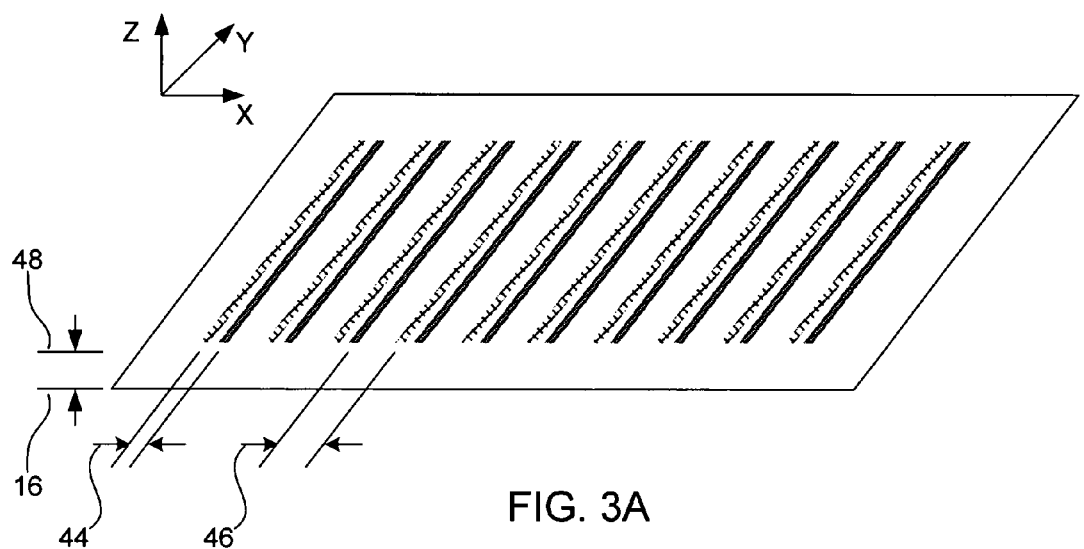
FIG. 3A is a simplified perspective diagram of a focus pattern with shifted structures, in accordance with one embodiment of the present invention.
Figure 3B:
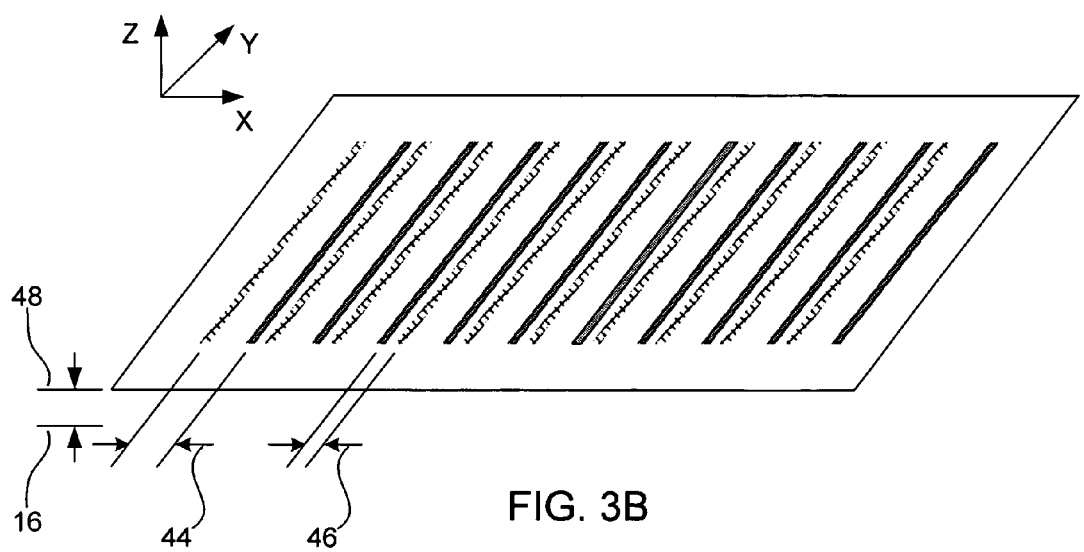
FIG. 3B is a simplified perspective diagram of a focus pattern with shifted structures, in accordance with one embodiment of the present invention.

Referring to FIGS. 3A and 3B, the spacings will be described in greater detail. In order to simplify the discussion, the focus pattern 12 includes interlaced periodic structures 22 and 24. As shown in FIG. 3A, for example, a negative change in focus (e.g., the difference between the ideal focus plane 48 and the surface 16 of the workpiece 18 in the negative Z direction) may correspond to a decrease in spacing 44 and an increase in spacing 46. In addition, as shown in FIG. 3B, a positive change in focus (e.g., the difference between the ideal focus plane 48 and the surface 16 of the workpiece 18 in the positive Z direction) may correspond to an increase in spacing 44 and a decrease in spacing 46. Furthermore, the amount of change (e.g., distance) in either direction may correspond to the magnitude of focus.

It should be noted that the FIGS. 3A and 3B are shown by way of example and not by way of limitation and thus the directional change of the spacings may be reversed. For example, a negative change in focus may correspond to an increase in spacing 44 and a decrease in spacing 46 while a positive change in focus may correspond to a decrease in spacing 44 and an increase in spacing 46. The manner in which the spacings change generally depends on the configuration of the focus masking structure.

In one implementation, the sign as well as the magnitude of defocus can be determined by comparing the actual spacings relative to their corresponding spacing at best focus. For example, the actual first spacing may be compared with the first spacing at best focus and/or the actual second spacing may be compared with the second spacing at best focus to determine focus errors. Alternatively, in another implementation, the sign as well as the magnitude of defocus can be determined by comparing the first spacing relative to the neighboring second spacing. For example, the first spacing may be compared with the second spacing to determine focus errors.

Figure 3C:
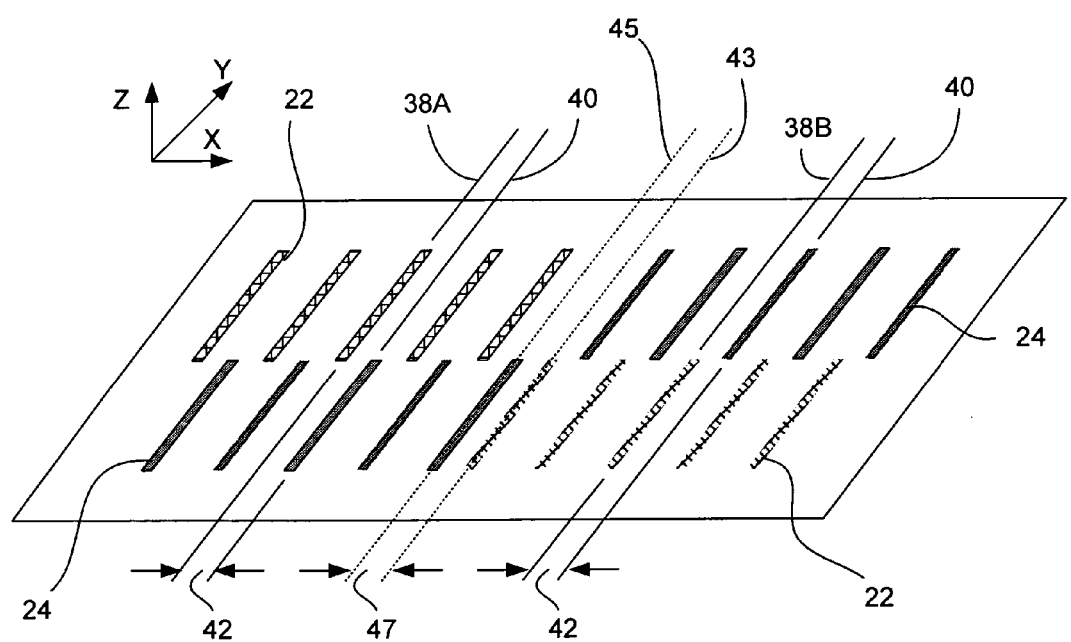
FIG. 3C is a simplified perspective diagram of a focus pattern with shifted structures, in accordance with one embodiment of the present invention.

In another embodiment, the centers of symmetry of the shifting structures are used to determine focus errors. Referring to FIG. 3C, the centers of symmetry will be described in greater detail. In order to simplify the discussion, the focus pattern 12 includes a plurality of spatially separated periodic structures 22 and 24. As shown in FIG. 3C, for example, the first periodic structures 22 may form a first center of symmetry 38 and the second periodic structure 24 may form a second center of symmetry 40. The centers of symmetry represent the center of their respective periodic structures, i.e., the centers of symmetry are imaginary lines parallel to the actual shifting lines with equal number of actual lines on either side. The centers of symmetry are typically determined by averaging the position of the lines contained within the periodic structures. As shown, the centers of symmetry form a spacing 42 therebetween.

Similar to the spacings between lines 26 and 28, the spacing 42 between centers of symmetry change as a function of focus. That is, the position of the centers 38, 40 and thus the center spacing 42 generally depends on the focus quality, i.e., the centers 38, 40 move further apart or closer together relative to the amount of misfocus, and they move in different directions relative to the direction of misfocus. As such, a spacing that is small or large compared with the spacing at best focus may indicate a positive or negative change in focus (i.e., the positive or negative Z-axis translation of the workpiece) and the distance between spacings may correspond to the magnitude of the focus change (i.e., offset displacement along the Z-axis).

Additionally, in the case where multiple periodic structures are used as shown in FIG. 3C, the centers of symmetry 38A&B for each of the periodic structures 22 may be averaged, and the centers of symmetry 40A&B for each of the periodic structures 40 may be averaged so as to produce a resultant center of symmetry 43 and 45, respectively, for each of the periodic structure groups 22 and 24. Much like above, the resultant centers of symmetry form a spacing 47 therebetween that changes as a function of focus.

In one implementation, the sign as well as the magnitude of defocus can be determined by comparing the center spacing 42 relative to the center spacing at best focus. For example, the focus may be determined by measuring the periodic structures 22 and 24, calculating the centers of symmetry 38, 40 for each of the periodic structures 22 and 24, and comparing the spacing 42 therebetween with the spacing at best focus (e.g., no shift).

In one embodiment, a measurement tool is used to measure the positional changes of the focus pattern. The measurement tool may be an in situ or ex situ measurement tool. That is, the measurement tool may be integrated with the lithography tool or it may be a stand alone device. With regards to the integrated measurement tool, the measurement tool may cooperate with the lithography process tool to change focus in real time or while the wafer is still in the lithography tool. That is, the measurement tool may provide a feedback control signal to the lithography tool so as to correct the focus. By way of example, the control signal may be used to control some aspect of the optics and/or wafer to achieve and maintain the best possible focus. For example, the position of the optics and/or the wafer may be adjusted so that the ideal focus plane substantially coincides with the surface of the wafer. Alternatively, the focus information may be displayed to an operator so that the operator may make adjustments.

The shifts associated with the focus pattern may be measured using suitable methods for measuring positional changes in the X or Y directions, as for example, the relative displacement (motion) of the lines 26 and 28 relative to each other, or the relative displacement between each of the periodic structures 22 and 24. In one embodiment, methods used for measuring overlay error may be used. That is, the focus masking structure is configured to create a focus pattern that can be measured using overlay measurement techniques. As is generally well known, overlay pertains to the determination of how accurately a first patterned layer aligns with respect to a second patterned layer disposed above or below it or to the determination of how accurately a first pattern aligns with respect to a second pattern disposed on the same layer. Any shift between separately generated patterns is known as overlay error.

Any suitable overlay measuring technique may be used. By way of example, scatterometry, scanning, imaging and other suitable techniques may be used. Each of these techniques is configured to generate a signal that can be directly or indirectly converted into focus information, i.e., direction and magnitude of focus. In one embodiment, a conversion algorithm or calibration curve is used to convert the signal to focus information that can be used by the system. Conversion algorithms and calibration curves generally provide predetermined focus data related to a given signal, i.e., this signal corresponds to this much change in focus. Conversion algorithms and calibration curves are well know in the art and for the sake of brevity will not be discussed in greater detail. In one implementation, the signal is converted into displacement information in accordance with a first calibration curve (i.e., this signal corresponds to this much change in position) and the displacement information is subsequently converted into focus information in accordance with a second calibration curve (this change in position corresponds to this much change in focus). In another implementation, the measured signal is directly converted to focus information (this signal corresponds to this much change in focus) without converting to displacement information.

In one embodiment, known overlay tools such as those capable of measuring the overlay error for separately generated overlay patterns may be modified to measure the focus dependent shifts and/or displacements of the components parts of the focus patterns described herein.

Figure 4:
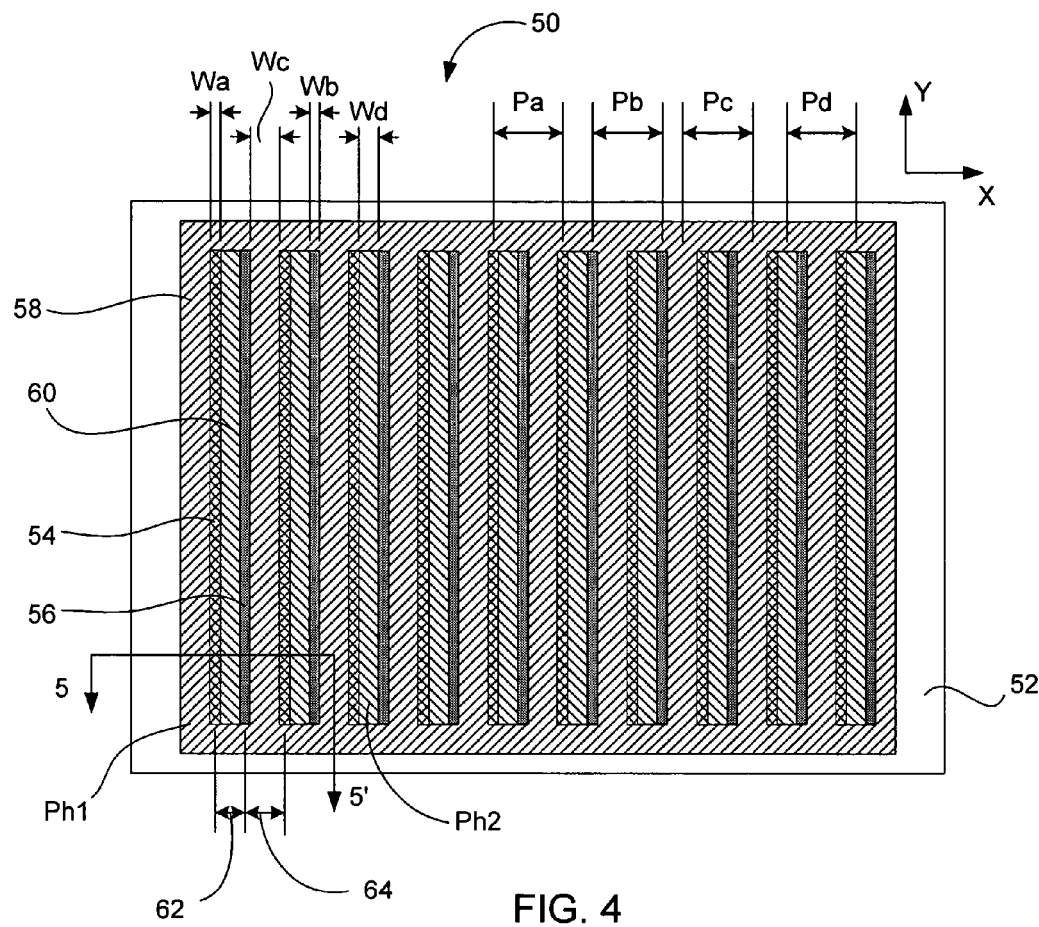
FIG. 4 is a top view of a focus masking structure, in accordance with one embodiment of the invention.

FIG. 4 is a top view of a focus masking structure 50, in accordance with one embodiment of the invention. By way of example, the focus masking structure 50 may generally correspond to the focus masking structure 10 shown in FIG. 2. In one embodiment, the focus masking structure 50 is constructed on a photolithographic mask. By way of example, the focus masking structure 50 may be part of a photolithographic mask used to create a circuit pattern on a wafer, or it may be part of a photolithographic mask used for testing certain attributes or characteristics (e.g., focus or optical aberrations) of a photolithographic system.

As shown, the focus masking structure 50 is positioned on a transparent substrate 52. By way of example, the transparent substrate may be formed from materials such as quartz or glass. The focus masking structure 50 generally consists of parallel source lines 54 and 56, which are separated by alternating phase shift zones 58 and 60. The source lines and phase shift zones may be widely varied. The source lines 54 and 56 generally represent areas of the masking structure configured for preventing the transmission of light. As such, the source lines 54 and 56 may be formed from a suitable light blocking material. By way of example, the source lines 54, 56 may be formed from metals such as chromium and chromium alloys that are deposited on the surface of the substrate 52. The phase shift zones 58 and 60, on the other hand, generally represent areas of the masking structure configured for allowing the transmission of light (albeit with a phase shift). As such, the phase shift zones 58 and 60 may be formed from suitable phase shifting materials disposed above or within the substrate 52. By way of example, the phase shifting zones 58, 60 may be formed by a portion of the substrate (e.g., openings, trenches and the like etched into the substrate) or they may be formed from other materials deposited above the surface of the substrate or a combination of the two.

It should be noted that sources may be formed from other materials besides metals. For example, the source lines may also be formed from a portion of the substrate or from other light effecting materials (e.g., chromeless phase shift mask).

In one embodiment, the alternating zones are constructed so that the optical phase difference (Ph1−Ph2) between the light transmitted by the neighboring zones 20 and 22 is not 0 or 180 degrees. Any suitable phase difference (Ph1−Ph2) may be used. For example, a phase difference (Ph1−Ph2) between about 10 degrees to about 170 degrees, and more particularly about 90 degrees may be used. The phase difference (Ph1−Ph2) is generally determined by the mask making capabilities of the process used to make the mask and the amount of sensitivity desired. It should be noted that for good focus sensitivity the phase difference should be closer to 90 degrees. In one implementation, the phase difference is configured to be as close as possible to 90 degrees without changing the mask making process. In another implementation, a dedicated process may be used to create the focus masking structure separate from the rest of the mask manufacturing process. For example, a separate patterning and etch process may be used (e.g., one that is similar to forming the circuit pattern). Alternatively, focus ion beam micro machining, atomic force microscope micromechanical machining, focused high intensity pulsed laser micro machining and the like may be used. In general, adding steps to the mask making process will increase costs.

The line widths of the source lines 54 and 56 are generally designated Wa and Wb, respectively while the zone widths of the phase shift zones 58 and 60 are generally designated Wc and Wd, respectively. The widths Wa, Wb, Wc and Wd may be widely varied. For example, they may or may not be equal to each other. In the illustrated embodiment, the widths Wa and Wb are configured to be equal to one another while the widths Wc and Wd are configured to be not equal to one another. It is generally believed that lines having equal widths Wa and Wb provides a measurement that is more similar to device features and therefore provides better correlation to device (e.g., circuit) performance parameters. In some methods of detection (e.g., scatterometry), it is believed that in an ideal phase shift mask there is low (or zero) sensitivity to positive and negative changes in the focus when Wc=Wd and therefore it is preferable to make them not equal. That is, it is difficult to determine the sign of focus when Wc=Wd. Furthermore, the widths Wc and Wd are generally configured to be larger than widths Wa and Wb.

The pitch of the source lines 54 and 56 are generally designated Pa and Pb, respectively while the pitch of the phase shift zones 58 and 60 are generally designated Pc and Pd, respectively. As should be appreciated, pitch is generally defined as the distance between specific lines or zones. The pitches Pa, Pb, Pc and Pd may be widely varied. In the illustrated embodiment, the pitches Pa, Pb, Pc and Pd are equal to one another. One advantage of equal pitches is simplicity of calculating reference signals.

The focus masking structure 50 may be a single or it may be used with other focus masking structures. In one embodiment, a combination of different focus masking structures may be used on a single photolithographic mask in order to increase the measurement range over which the defocus can be uniquely determined. For example, the focus masking structures may have different focus characteristics, i.e., best focus spacings and/or different relative phase shifts.

Figure 5:
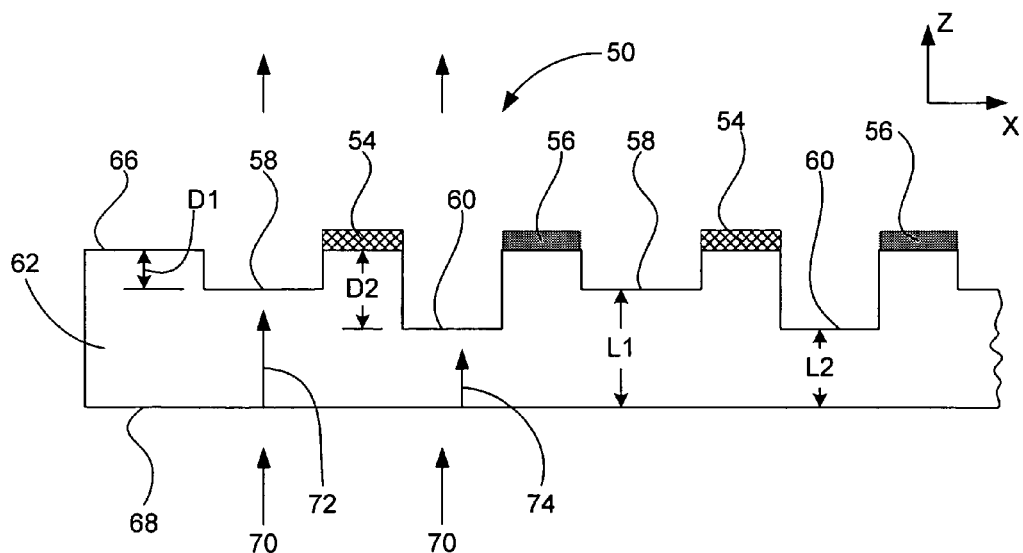
FIG. 5 is a broken away side view, in cross section, of a focus masking structure, in accordance with one embodiment of the invention.

FIG. 5 is a broken away side view, in cross section (taken along line 5–5' as shown in FIG. 4), of the focus masking structure 50, in accordance with one embodiment of the invention. In this embodiment, the source lines 54 and 58 are deposited on a front surface 66 of the substrate 52 and the phase shift zones 58 and 60 are etched into the substrate 52. By etching both of the phase shift zones 58 and 60, the light transmission therethrough is more similar.

As shown, the phase shift zones 58 and 60 are etched to different depths so as to produce different phase shifts. That is, the first phase shift zone 58 is etched to a first depth D1 relative to the surface 54 of the substrate and the second phase shift zone 60 is etched to a second depth D2 relative to the surface 54 of the substrate. Any suitable arrangement of depths may be used (e.g., deep/shallow, shallow/deep). In the illustrated embodiment, the second depth D2 is deeper than the first depth D1. The phase shift zones thus produce different path lengths L1 and L2 through the substrate that change the phase of light coming through the substrate. That is, when light 70 is made incident on a back surface 68 of the substrate 66, light 72 going through phase shift zone 58 travels the distance L1 through the substrate 66 thus producing a first phase Ph1. In addition, light 74 going through phase shift zone 60 travels the distance L2 through the substrate 66 thus producing a second phase Ph2. This arrangement produces a zones of minimum light intensity that make more distinct shadows and that move to the left or right according to the sign and magnitude of the system defocus and the phase difference Ph1−Ph2 (e.g., positive sign moves in one direction, and negative sign moves in the opposite direction).

To elaborate, $Ph1=L1(n_{mask})+D1(n_{air})$ and $Ph2=L2(n_{mask})+D2(n_{air})$, where n=the index of refraction for the mask and air, respectively. Furthermore, $Ph1=T(n_{mask})+D1(n_{air}-n_{mask})$ and $Ph2=T(n_{mask})+D2(n_{air}-n_{mask})$ where T=the total path distance (either L1+D1 or L2+D2).

Figure 6:
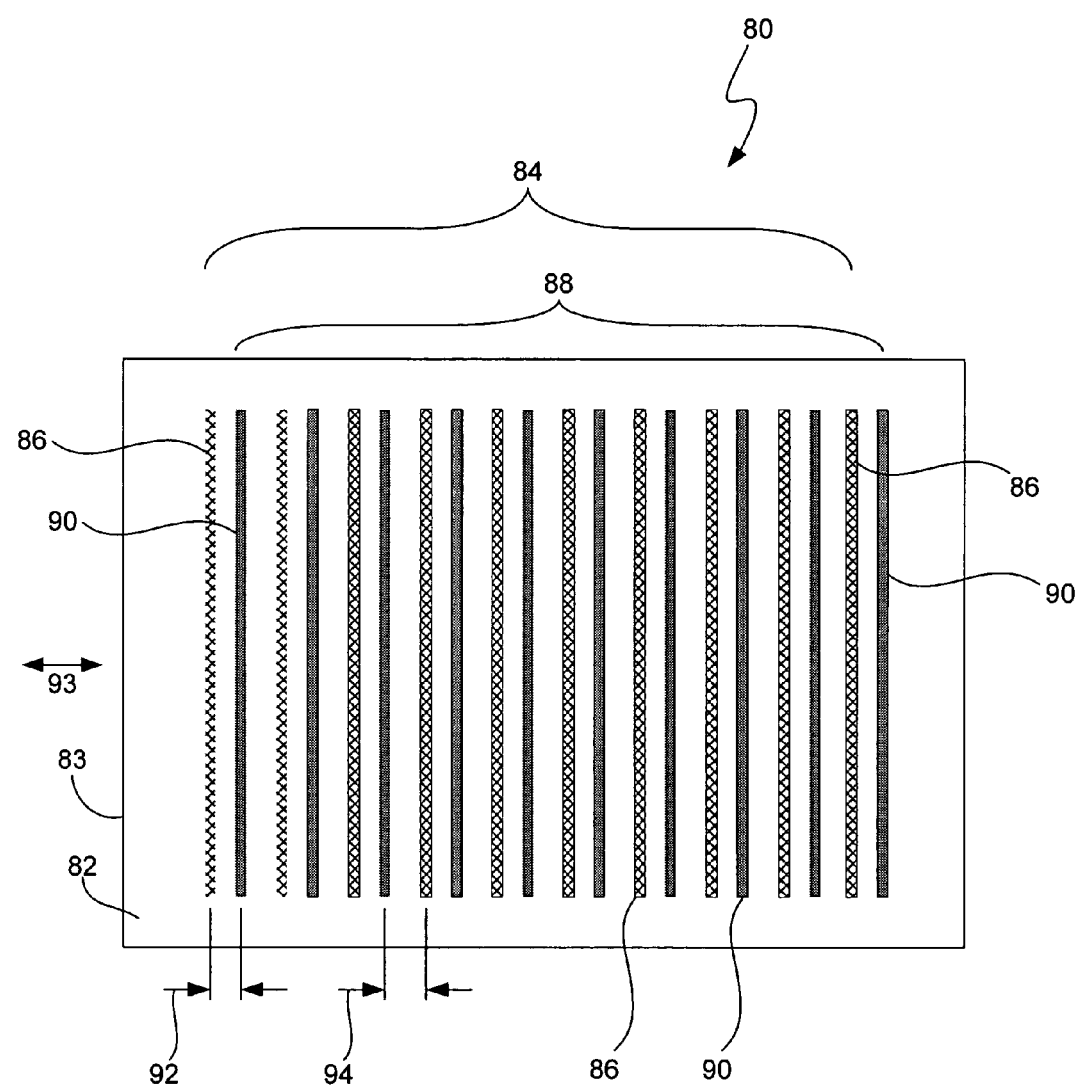
FIG. 6 is a top view of a focus pattern, in accordance with one embodiment of the invention.

FIG. 6 is a top view of a focus pattern 80, in accordance with one embodiment of the invention. By way of example, the focus pattern 80 may generally correspond to the focus pattern 14 shown in FIG. 2 and may generally be produced by the focus masking structure 50 shown in FIG. 4. In general, the focus pattern 80 is printed on the surface 82 of a workpiece 83 when light is made to travel through the masking structure. By way of example, the surface 82 may represent an exposed layer of photoresist, a developed layer of photoresist, an underlying layer of the wafer (e.g., etched into metal or dielectric) and/or the like. In one embodiment, the workpiece is a semiconductor wafer. The focus pattern 80 generally includes a first periodic structure 84 of parallel printed lines 86 (shown by cross hatching) and a second periodic structure 88 of parallel printed lines 90 (shown by shading). The first set of parallel printed lines 86 correspond to the Ph1 to Ph2 transition, while the second set of printed parallel lines corresponds to the Ph2 to Ph1 transition.

As shown, the first periodic structure 84 is generally interposed or interlaced with the second periodic structure 88 such that the printed lines 86 alternate with the printed lines 90 along an axis 93, i.e., the lines of the periodic structures are parallel to one another so as to provide position information in a single direction (e.g., X, Y, etc.). Furthermore, as shown, adjacent lines 86 and 90 form a first spacing 92 (left to right from 86 to 90) and a second spacing 94 (left to right from 90 to 86). As the system goes in and out of focus these lines either move apart or together thus changing the first and second spacings. For example, one focus value may move the lines further apart while another focus value may move the lines closer together. As should be appreciated, the change in 86 to 90 and 90 to 86 provide measurable information that can be converted to actual focus information, i.e., changes in these distances will indicate the focus value.

The number of lines 86, 90 inside each periodic structure 84, 88 may be varied to meet the specific needs of each focus pattern. From the perspective of the minimum number of lines that is needed for operation, that number is two. In the embodiment shown, each of the periodic structures includes 10 coarsely segmented lines. In some cases, it may even be desirable to have periodic structures having a different number of lines, i.e., a first periodic structure having 5 lines and a second periodic structure having 10 lines. Furthermore, the line configuration of each of the periodic structures, i.e., pitch, linewidths and spacings, may be varied to meet the specific needs of each focus pattern. In the illustrated embodiment, each of the periodic structures 84, 88 has the same pitch, linewidths and spacings. That is, each of the periodic structures 84, 88 has equal linewidths and equal spacings therebetween.

The shifts or relative displacement between interlaced periodic structures, as for example the periodic structures shown in FIG. 6, may measured using a variety of techniques.

In one embodiment, the shifts between interlaced periodic structures are measured via scatterometry (e.g., reflectometry, spectroscopic ellipsometry, multiwavelength reflectometry or angle resolved scatterometry). In scatterometry, a measurement signal(s) corresponding to the shifts between periodic structures is acquired with one or more light or radiation beams that are made incident on the pattern and one or more detectors that detect the scattered, reflected and/or diffracted beams emanating from the pattern. As should be appreciated, the scattered, reflected and/or diffracted light changes in accordance with the shifting structures and thus the scattered, reflected and/or diffracted light may be used to determine the relative displacement between the shifting structures. For example, when the spacing changes between lines, the scattered, reflected and/or diffracted light may be less or more intense at a certain wavelength or polarization and/or the optical phase may be altered. The modifying (e.g., scattering, reflecting and/or diffracting) of light from the printed pattern may be determined by many factors including but not limited to: the linewidths, line spacings, the pitch, the optical properties (n(lambda), k(lambda), the shapes and profiles (e.g., critical dimensions), height, sidewall angle, sidewall roughness, T-toppings, footing, features, volume, etc. Scatterometry may also be used to determine the shapes of the printed lines. For example, printed in individual separate grating structures of purely 86 or purely 90, i.e., specular reflection direction. This information can be fed-forward into the analysis of the signal so as to enable a better or faster determination of focus quality.

The beam(s) is generally detected at the same angle that it was brought in at, however, it may also be detected at other angles. The measurement may be performed in a fixed angle, sprectroscopic ellipsometry mode, in an angle scanning single or multiple wavelength mode, or in a multiple angle, multiple wavelength mode. That is, the beam(s) may be brought in at a single or multiple angles and they may be brought in at a single wavelength or at multiple wavelengths. In addition, the beams may be detected at a single angle or multiple angles and they may be detected at single or multiple wavelengths. Furthermore, the intensity, polarization and/or optical phase of the beams may be detected at different angles and/or different wavelengths. By way of example, scatterometry techniques that may be used are described in greater detail in a pending U.S. patent application Ser. No. 09/833,084, titled "Periodic Patterns and Technique to Control Misalignment Between Two Layers, "filed on Apr. 10, 2001, and which is herein incorporated by reference.

In another embodiment, the shifts between interlaced periodic structures are measured via scanning techniques. In scanning, a signal corresponding to the shifts between periodic structures is acquired with a scanning light or electron beam and one or more detectors that detect the reflected or scattered beam in one or more scattering directions. By way of example, representative scanning techniques that may be used are described in greater detail in U.S. Pat. Nos. 6,023,338 and 6,079,256 issued to Bareket, which are herein incorporated by reference.

FIGS. 7A and 7B are perspective views of a focus masking system 100, in accordance with one embodiment of the invention. The focus masking system 100 is configured to utilize a focus masking structure 102 and a trim masking structure 104 to produce a focus pattern 106 on a wafer 108. By way of example, the focus masking structure 102 may correspond to the focus masking structure 50 shown in FIG. 4. In general, the focus masking structure 102 determines the displacement of the periodic structures 118 in the focus pattern 106, and the trim masking structure 104 determines what part of the focus pattern can be measured. In most cases, the wafer 108 includes a layer of photoresist 110, which when exposed to the light, captures the latent image of the focus pattern 106 therein. The focus masking system 100 is configured to produce the focus pattern 106 in two steps: a first exposure (as shown in FIG. 7A) and a second exposure (as shown in FIG. 7B). In the first exposure, light 112 is made to travel through the focus masking structure 102 to produce an initial focus pattern 114 on the wafer 108, i.e., some portions of the photoresist are exposed and some portions are not exposed. By way of example, the initial focus pattern 114 may correspond to the focus pattern 80 shown in FIG. 6. In the second exposure, light 116 is made to travel through the trim masking structure 104 to change the initial focus pattern 114 into the final focus pattern 106, i.e., select portions of the non-exposed portions of the photoresist are exposed. In essence, the trim masking structure 104 allows select portions of the focus pattern 114 to be removed therefrom so as to create a different focus pattern 106.

In the illustrated embodiment, the trim masking structure 104 is arranged to form a focus pattern 106 having spatially distinct and multiple periodic structures 118A–D, which include a plurality of coarsely segmented lines 119. By constructing patterns with spatially distinct periodic structures, it is possible to implement a broader range of focus measurement algorithms that maximize the benefits of higher information density in the pattern. That is, the plurality of coarsely segmented lines 119 increase the amount of information that may be used for focus measurements. In addition, it is generally believed that by distributing the periodic structures to more points within the perimeter of the pattern, the more likely they are to balance out the non-uniformities caused by the process.

In one embodiment, the focus masking structure and the trim masking structure are disposed on the same substrate. In this embodiment, a stepper may move the substrate to a first position so as to make an exposure with the focus masking structure and thereafter move the substrate to a second position so as to make a second exposure with the trim masking structure. That is, the stepper may be programmed to select which portion of the mask is used at one time. In another embodiment, the focus masking structure and the trim masking structure are disposed on different substrates. In this embodiment, a stepper may move a focus masking structure on a first substrate into an exposure position so as to make a first exposure, and thereafter move a trim masking structure on a second substrate into the exposure position to make a second exposure.

Figure 8:
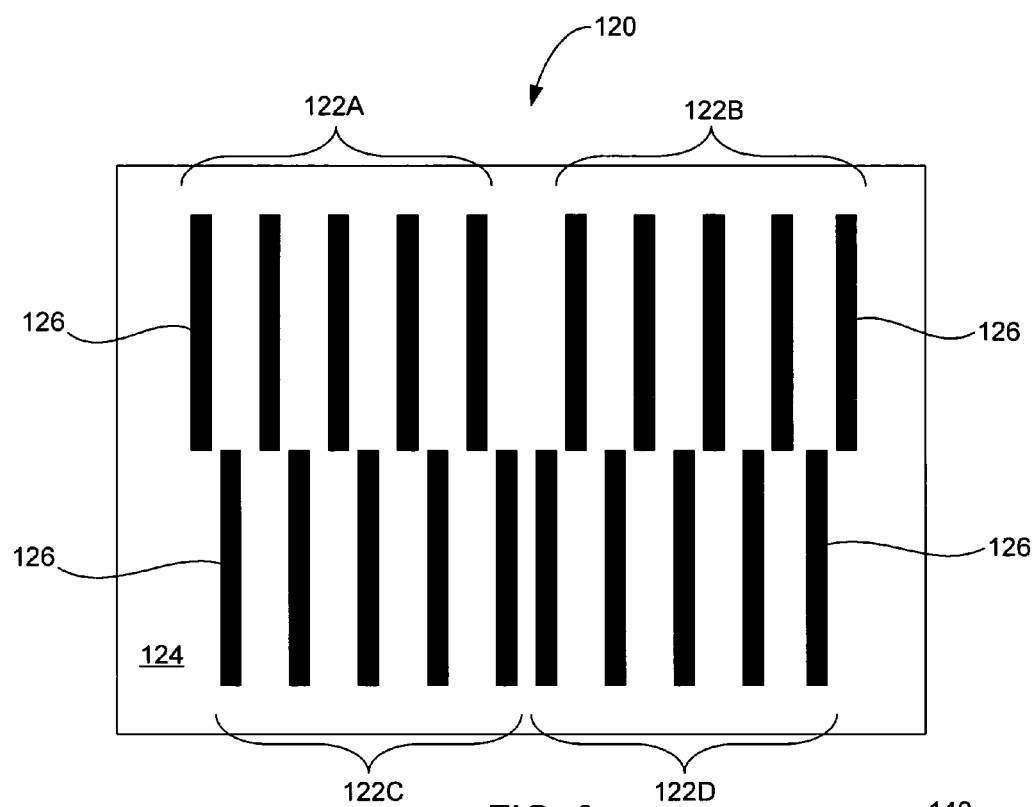
FIG. 8 is a top view of a trim masking structure, in accordance with one embodiment of the invention.

FIG. 8 is a top view of a trim masking structure 120, in accordance with one embodiment of the invention. By way of example, the trim masking structure 120 may generally correspond to the trim masking structure shown in FIG. 7B. In one embodiment, the trim masking structure 120 may be used along with the focus masking structure 50 of FIG. 4 to produce a focus pattern with spatially distinct and multiple periodic structures. The trim masking structure 120 generally includes a plurality of masking zones 122A–D, which are disposed on a transparent substrate 124. Each of the masking zones 122A–D is configured to produce a separate periodic structure.

As shown, each of the masking zones 122A–D includes a plurality of masking lines 126. The masking lines 126 are configured to cover select portions of a pre existing focus pattern so as to prevent further exposure thereto. That is, the trim masking lines protect the areas where the pattern is desired, and the open areas therebetween let light through thereby erasing the latent pattern in the areas that are not desired. In most cases, the masking lines 126 are used to cover select portions of the printed lines of the initial focus pattern produced by the focus masking structure. In cases such as these, the masking lines 126 generally have a linewidth larger than the linewidth of the printed lines. In addition, the masking lines generally have a pitch equal to the pitch of the printed lines for which they are configured to cover. The masking lines 126 are generally formed from a light blocking material. By way of example, the masking lines 126 may be formed from light blocking materials that are deposited on the surface of the substrate 124.

Although, the order of patterning the focus pattern is described using the focus masking structure first and the trim masking structure second, it should be noted that this is not a limitation. For example, the order in which the trim masking structure and focus masking are applied (to create the focus pattern) may be reversed.

Any suitable arrangement of the masking zones may be used. In the illustrated embodiment, the first masking zone 122A is positioned in an upper left portion of the substrate 124, the second masking zone 122B is positioned in an upper right portion of the substrate 124, the third masking zone 122C is positioned in a lower left portion of the substrate 124 and the fourth masking zone 122D is positioned in the lower right portion of the substrate 124. Furthermore, any suitable number of masking lines 126 may be used. In general, the number of masking lines corresponds to the number of printed lines that need to be covered to produce the desired periodic structure. In the illustrated embodiment, each of the masking zones includes five masking lines.

Referring to FIGS. 6 an and 8, during the second exposure, the first masking zone 122A is configured to cover an upper left portion of the initial focus pattern 80 so as to produce a first periodic structure in the upper left portion of the final focus pattern. In particular, the masking lines 126A of the first masking zone 122A are configured to cover a first group of exposed lines so as to prevent exposure thereto. By group of printed lines, it is generally meant a group of the printed lines 86 or a group of the printed lines 90. Furthermore, each of the masking lines 126A is configured to cover an individual printed line from the group of printed lines. In the illustrated embodiment, the first group of lines corresponds to the first five printed lines 86 (from left to right). As such, the first masking line 126A covers the first printed line 86, the second masking line 126A covers the second printed line 86, and so forth. In one implementation, the masking lines 126A are configured to partially cover the printed lines 86. For example, as shown, the masking lines 126A are arranged to cover an upper left portion of some of the printed lines 86.

The second masking zone 122B is configured to cover an upper right portion of the initial focus pattern 80 so as to produce a second periodic structure in the upper right portion of the final focus pattern. In particular, the masking lines 126B of the second masking zone 122B are configured to cover a second group of printed lines so as to prevent exposure thereto. By group of printed lines, it is generally meant a group of the printed lines 86 or a group of the printed lines 90. Furthermore, each of the masking lines 126B is configured to cover an individual printed line from the group of printed lines. In the illustrated embodiment, the second group of lines corresponds to the last five printed lines 90 (from left to right). As such, the first masking line 126B covers the 6th printed line 90, the second masking line 126B covers the 7th printed line 90, and so forth. In one implementation, the masking lines are configured to partially cover the printed lines. For example, as shown, the masking lines 126B are arranged to cover an upper portion of the printed line 90.

The third masking zone 122C is configured to cover a lower left portion of the initial focus pattern 80 so as to produce a third periodic structure in the lower left portion of the final focus pattern. In particular, the masking lines 126C of the third masking zone 122C are configured to cover a third group of printed lines so as to prevent exposure thereto. By group of printed lines, it is generally meant a group of the printed lines 86 or a group of the printed lines 90. Furthermore, each of the masking lines 126C is configured to cover an individual printed line from the group of printed lines. In the illustrated embodiment, the third group of lines corresponds to the first five printed lines 90 (from left to right). As such, the first masking line 126C covers the first printed line 90, the second masking line 126C covers the second printed line 90, and so forth. In one implementation, the masking lines are configured to partially cover the printed lines. For example, as shown, the masking lines 126C are arranged to cover a lower portion of the printed line 90.

The fourth masking zone 122D is configured to cover a lower right portion of the initial focus pattern 80 so as to produce a second periodic structure in the lower right portion of the final focus pattern. In particular, the masking lines 126D of the second masking zone 122D are configured to cover a fourth group of printed lines so as to prevent exposure thereto. By group of printed lines, it is generally meant a group of the printed lines 86 or a group of the printed lines 90. Furthermore, each of the masking lines 126D is configured to cover an individual printed line from the group of printed lines. In the illustrated embodiment, the fourth group of lines corresponds to the last five printed lines 86 (from left to right). As such, the first masking line 126D covers the 6th printed line 86, the second masking line 126D covers the 7th printed line 86, and so forth. In one implementation, the masking lines are configured to partially cover the printed lines. For example, as shown, the masking lines 126D are arranged to cover a lower portion of the printed line 86.

Figure 9:
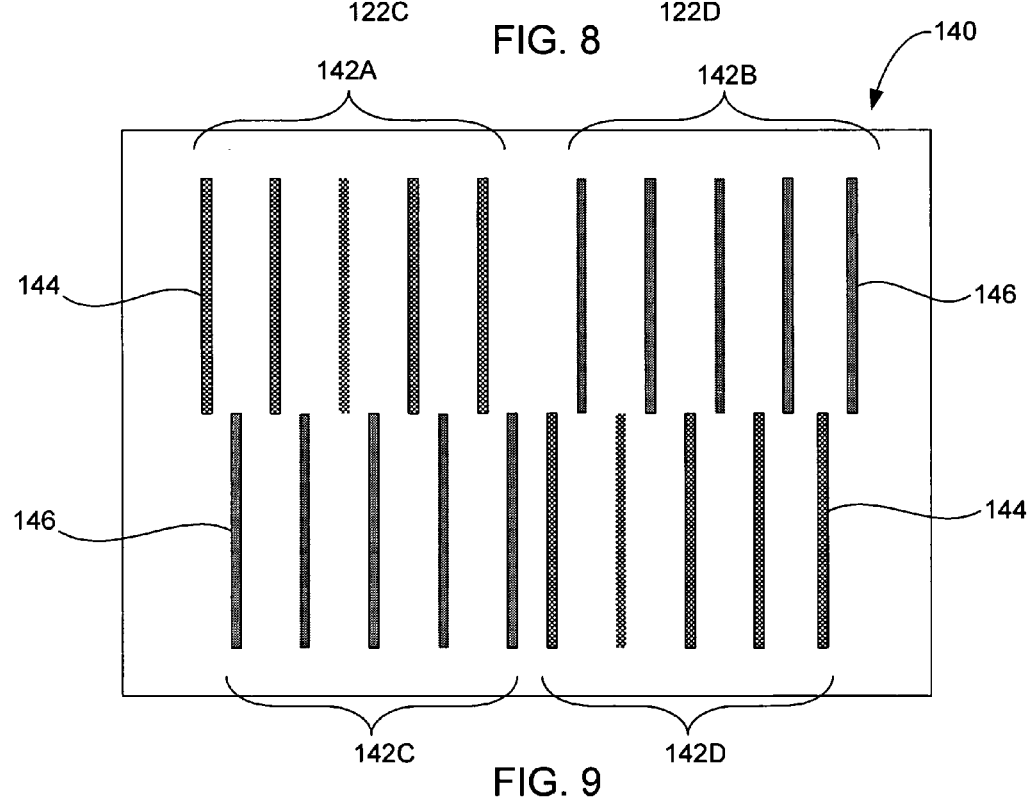
FIG. 9 is a top view of a focus pattern, in accordance with one embodiment of the invention.

FIG. 9 is a top view of a focus pattern 140, in accordance with one embodiment of the invention. In one embodiment, the focus pattern 140 is produced by the focus masking structure 50 of FIG. 4, and the trim masking structure of FIG. 8, in accordance with the focus masking system of FIGS. 7A and 7B. The focus pattern 140 includes a plurality of periodic structures 142A–D that generally correspond to the configuration of the masking zones 122A–D. Periodic structures 142A and 142D are formed from a first set of parallel printed lines 144 (shown by cross hatching) while periodic structures 142B and 142C are formed from a second set of parallel printed lines 146 (shown by shading). The parallel printed lines 144, 146 generally correspond to the configuration (i.e., pitch, linewidths and spacings) of the parallel printed lines 86 and 90, respectively.

As shown, the periodic structures 142A–D are spatially separated from one another so that they do not overlap portions of an adjacent periodic structure (i.e., each of the periodic structures represents a different area of the pattern). Further, the periodic structures 142A and 142D are offset relative to periodic structures 142B and 142C in the X-direction such that the lines of the periodic structures do not line up. That is, the lines of periodic structures disposed below or above one another do not align. In the illustrated embodiment, the periodic structures 142A and 142D are offset to the left of periodic structures 142B and 142C.

Further still, periodic structure 142A is diagonally opposed to periodic structures 142D, and periodic structures 142B is diagonally opposed to periodic structures 142C. Moreover, periodic structures 142A is displaced from periodic structures 142D, and periodic structures 142B is displaced from periodic structures 142D. For example, the center of periodic structures 142D is positioned below and to the right of the center of periodic structure 142A, and the center of periodic structures 142C is positioned below and to the left of the center of periodic structures 142B. As should be appreciated, these cross-positioned structures form an "X" shaped pattern.

In an alternate embodiment, the configurations of the focus masking structure and the trim masking structure may be reversed. That is, the focus masking structure may include a plurality of spatially distinct periodic regions and the trim masking structure may include a plurality of parallel masking lines. When at 0 defocus, this arrangement may be used to produce a focus pattern having a plurality of periodic structures that are aligned rather than offset as shown in FIG. 9. That is, the periodic structures are not offset or shifted relative to an adjacent periodic structure disposed above or below it. For example, the parallel lines of the first periodic structure may be positioned in line with the parallel lines of the third periodic structure. When the system is out focus, the locations of the printed lines may change from their aligned position thus permitting measurement of the system defocus from the relative displacement of the lines and their corresponding structure.

Figure 10:
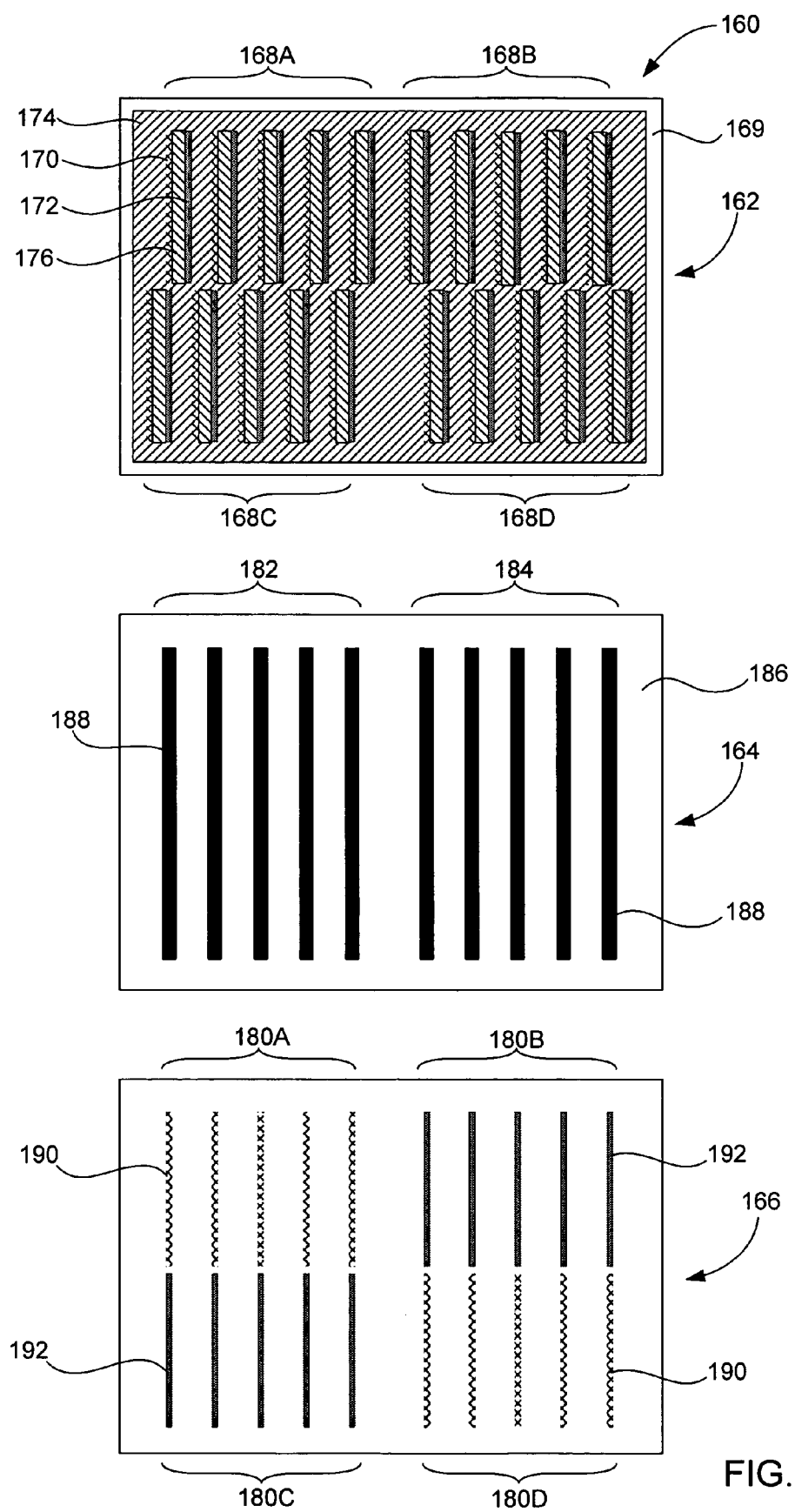
FIG. 10 is a top view of a focus masking system and a focus pattern, in accordance with another embodiment of the invention.

To facilitate discussion, FIG. 10 illustrates a focus masking system 160, in accordance with another embodiment of the invention. The focus masking system 160 is configured to utilize a focus masking structure 162 and a trim masking structure 164 to produce a focus pattern 166. Although shown in top views, the focus masking system 160 may generally correspond to the focus masking system 100 shown in FIG. 7.

In this embodiment, the focus masking structure 162 includes a plurality of spatially distinct regions 168A–D, which are disposed on a transparent substrate 169. Each of the regions 168A–D is configured to produce a separate and spatially distinct periodic structure. Each of the regions 168A–D includes parallel source lines 170 (shown by cross hatching) and 172 (shown by shading), which are separated by alternating phase shift zones 174 and 176.

Any suitable arrangement of the regions 168A–D may be used. In the illustrated embodiment, the first region 168A is positioned in an upper left portion of the substrate 169, the second region 168B is positioned in an upper right portion of the substrate 169, the third region 168C is positioned in a lower left portion of the substrate 169 and the fourth region 168D is positioned in the lower right portion of the substrate 169. Furthermore, the first region 168A is offset relative to the third region 168C and the second region 168B is offset relative to the fourth region 168D. In order to generate a final focus pattern 166 having nominally aligned periodic structures 180A–D, the parallel source lines 170 of the first periodic region 168A are configured to be aligned with the parallel source lines 172 of the third periodic region 168C and the parallel source lines 172 of the second periodic region 168B are configured to be aligned with the parallel source lines 170 of the fourth periodic region 168D. The lines are nominally aligned when at zero focus error depending on the phase difference Ph1–Ph2.

The trim masking structure 164 may be used along with the focus masking structure 162 to produce the focus pattern 166 with spatially distinct and multiple periodic structures 180. The trim masking structure 164 generally includes a pair of masking zones 182 and 184, which are disposed on a transparent substrate 186. Each of the masking zones 182 and 184 is configured to cooperate with the regions 168 of the focus masking structure 162 to produce a focus pattern 166 with a plurality of periodic structures 180. As shown, each of the masking zones 182 and 184 includes a plurality of masking lines 188. The masking lines 188 are configured to cover select portions of a pre existing focus pattern so as to prevent exposure thereto. In most cases, the masking lines 188 are used to cover select portions of the printed lines of an initial focus pattern.

Any suitable arrangement of the masking elements may be used. In the illustrated embodiment, the first masking zone 182 is positioned on a left portion of the substrate 186, and the second masking zone 184 is positioned on a right portion of the substrate 186. Furthermore, any suitable number of masking lines 188 may be used. In general, the number of masking lines 188 corresponds to the number of printed lines that need to be masked to produce the desired periodic structure (masked from the second exposure). In the illustrated embodiment, each of the masking elements includes five masking lines. During the second exposure, the first masking element 182 is configured to cover the aligned printed lines formed by the aligned first and third regions 168A and C of the focus masking structure 162. The second masking element 184, on the other hand, is configured cover the aligned printed lines formed by the aligned second and fourth regions 168B and D of the focus masking structure 162. When the second exposure is completed, a focus pattern such as the focus pattern 166 may be produced.

The focus pattern 166 includes a plurality of periodic structures 180A–D that generally correspond to the configuration of the regions 168A–D. Periodic structures 180A and 180D are formed from a first set of parallel printed lines 190 (shown by cross hatching) while periodic structures 180B and 180C are formed from a second set of parallel printed lines 192 (shown by shading). The parallel printed lines 190, 192 generally correspond to the configuration (i.e., pitch, linewidths and spacings) of the parallel printed lines formed by the focus masking structure 162.

As shown, the periodic structures 180A–D are spatially separated from one another so that they do not overlap portions of an adjacent periodic structure (i.e., each of the periodic structures represents a different area of the pattern). Further, periodic structures 180A and 180D are aligned relative to periodic structures 180B and 180C. As such, the printed lines 190 of periodic structure 180A line up with the printed lines 192 of the third periodic structure 180C, and the printed lines 192 of the second periodic structure 180B line up with the printed lines 190 of the fourth periodic structure 180D.

Further still, periodic structures 180A and 180D, which are formed from the first set of printed lines 190, are positioned opposite one another at a first vertical angle while periodic structures 180B and 180C, which are formed from the second set of printed lines 192, are positioned opposite one another at a second vertical angle. That is, periodic structures 180A is diagonally opposed to periodic structures 180D, and periodic structures 180B is diagonally opposed to periodic structures 180C. Moreover, periodic structures 180A is displaced from periodic structures 180D, and periodic structures 180B is displaced from periodic structures 180D. For example, the center of periodic structures 180D is positioned below and to the right of the center of periodic structures 180A, and the center of periodic structures 180C is positioned below and to the left of the center of periodic structures 180B. As should be appreciated, these cross-positioned structures form an "X" shaped pattern.

The shifts or relative displacement between spaced apart periodic structures, as for example the periodic structures of the focus patterns shown in FIGS. 8 and 9, may measured using a variety of techniques.

In one embodiment, the shifts between spaced apart periodic structures are measured via imaging techniques. In imaging a measurment signal corresponding to the shifts between periodic structures is acquired by capturing an image of the focus pattern with a microscope and a camera. In one implementation, the imaging technique includes selecting, from the captured image, at least one working zone (e.g., periodic structures) from each phase shift group (e.g. Ph1 to Ph2 and Ph2 to Ph1), forming representative signals for each of the selected working zones, and comparing the signal from the first phase shift group (e.g. Ph1 to Ph2) to the second phase shift group (Ph2 to Ph1) to determine the relative shift between different phase shift groups. The resulting relative shift (analogous to an overlay signal) is converted to a focus measurement or focus error measurement. By way of example, representative imaging techniques that may be used are described in greater detail in a pending U.S. patent application Ser. No. 09/894,987, titled "OVERLAY MARKS, METHODS OF OVERLAY MARK DESIGN AND METHODS OF OVERLAY MEASUREMENTS," filed on Jun. 27, 2001, which is herein incorporated by reference.

In another embodiment, the shifts between spaced apart periodic structures are measured via scanning techniques. In scanning, a signal corresponding to the shifts between periodic structures is acquired with a scanning light or electron beam and one or more detectors that detect the reflected or scattered beam in one or more scattering directions. By way of example, representative scanning techniques that may be used are described in greater detail in U.S. Pat. Nos. 6,023,338 and 6,079,256 issued to Baraket, which are herein incorporated by reference.

In another embodiment, the shifts between spaced apart periodic structures are measured via phase based techniques. In phase based techniques, a measurement signal corresponding to the shifts between periodic structures is acquired by measuring an interference signal from two or more coherent light beams reflected or scattered from the different periodic structures. In particular, it is preferable to measure the +1 or −1 diffraction orders from the coherent light beams.

By way of example, representative phase base techniques that may be used are described in greater detail in a pending U.S. patent application Ser. No. 09/639,495, titled "Metrology System Using Optical Phase," filed on Aug. 14, 2001, which is herein incorporated by reference.

Figure 11:
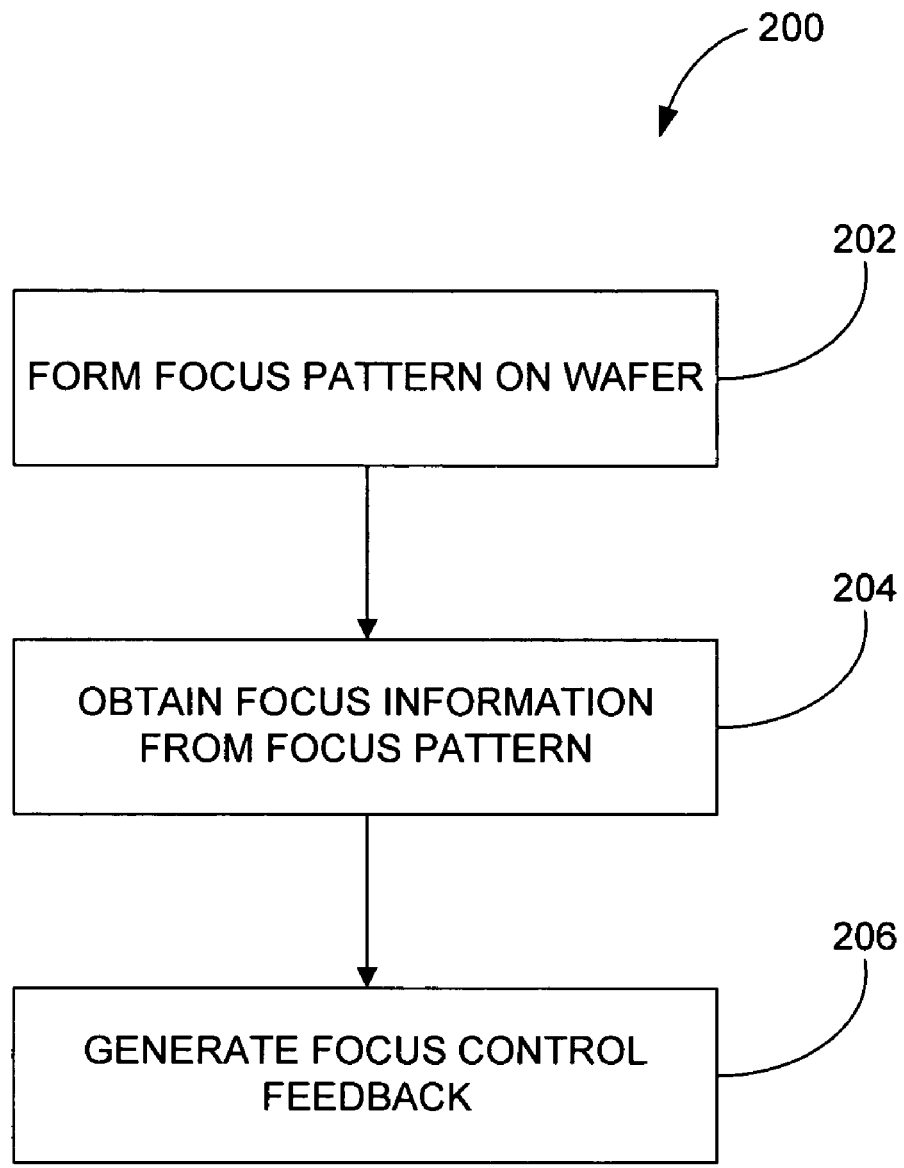
FIG. 11 is a flow diagram of focus processing, in accordance with one embodiment of the present invention.

FIG. 11 is a flow diagram of focus processing 200, in accordance with one embodiment of the present invention. Prior to starting the process 100 conventional process steps may be performed. For example, a mask having a focus or trim masking structure and/or a wafer having a photoresist layer disposed thereon may be loaded into a lithography system.

The process 200 generally begins at block 202 where a focus pattern is formed on a wafer. The focus pattern generally includes a plurality of periodic structures having parallel lines, which shift in accordance with system defocus. In one embodiment, the focus pattern is a portion of an exposed resist layer disposed on the surface of the wafer (latent image). This is generally accomplished by shining light or radiation through a focus or trim masking structure so as to expose select portions of the resist layer to the light. In one implementation, the focus pattern is produced by a focus masking structure (single exposure). By way of example, the focus pattern may be produced by the focus masking structure 50 shown in FIG. 4. In another implementation, the focus pattern is produced by a focus masking structure and a trim masking structure (dual exposure). By way of example, the focus pattern may be produced by the focus masking structure 50 shown in FIG. 4 and the trim masking structure 120 shown in FIG. 8 or the focus masking structure 162 and trim masking structure 164 shown in FIG. 10.

In another embodiment, the focus pattern is a portion of a developed resist layer disposed on the surface of the wafer.

In yet another embodiment, the focus pattern is a portion of an etched underlayer of the wafer. For example, the focus pattern may be an etched metal layer, etched semiconducting layer, an etched dielectric layer or an etched substrate layer (e.g., silicon wafer). This is generally accomplished by etching through the developed resist pattern, which serves as an etch mask, using well known etching techniques.

Following block 202, the process proceeds to block 204 where focus information from the focus pattern is obtained. This is generally accomplished by detecting the relative shift between periodic structures of the focus pattern, generating a displacement signal based on the shift, and converting the displacement signal to focus information. The shift may be detected using any suitable measuring technique (e.g., scatterometry, scanning, imaging, phase based techniques and the like). In some cases, the displacement signal corresponds to the displacement between spacings of alternating parallel lines. In other cases, the displacement signal corresponds to the displacement between the periodic structures themselves (e.g., centers of symmetry). Once the displacement signal is generated by the measuring system, the displacement signal can be converted into focus information (e.g., direction and magnitude of focus, optical aberrations, and the like).

The focus information may be determined from the displacement signal or from a signal derived from the displacement signal. In one embodiment, the displacement signal is converted to an overlay signal and the overlay signal is converted to a focus measurement or focus error measurement. In another embodiment, the displacement signal is converted to a focus measurement or focus error measurement.

Both embodiments may be accomplished using a reference signal, calibration curve or conversion algorithm. That is, the displacement signal may be converted into displacement information (e.g., overlay) in accordance with a first calibration curve (i.e., this signal corresponds to this much change in position) and the displacement information may be subsequently converted into focus information in accordance with a second calibration curve (this change in position corresponds to this much change in focus). Alternatively, the displacement signal may be directly converted to focus information (this signal corresponds to this much change in focus) using a single calibration curve and without converting to displacement information (overlay). The reference signal, calibration curve and conversion algorithms may be contained in a database.

After obtaining the focus information at block 204, the process flow proceeds to block 206 where a focus control signal is generated in accordance with the focus information. The focus control signal may be generated automatically via a control computer or manually via an operator. In most cases, a determination is made to how much to adjust the stepper focus control. For instance, the focus information may indicate that the system is positively or negatively out of focus by a certain distance. That is, the image plane of the focussed image may be offset relative to its optimum position. By way of example, the optimum position may be the surface of the wafer or positions close to the surface of the wafer. Based on this information, a control signal can be produced so as to move the image plane to the optimum position so as to produce optimum focus. By way of example, the focussing optics or the wafer may be moved along the z axis in order to compensate for the offset.

After generating a focus control signal at block 208, the focus processing 200 is complete and ends. It should be noted, however, that the focus processing can be repeatedly performed throughout wafer processing.

Figure 12:
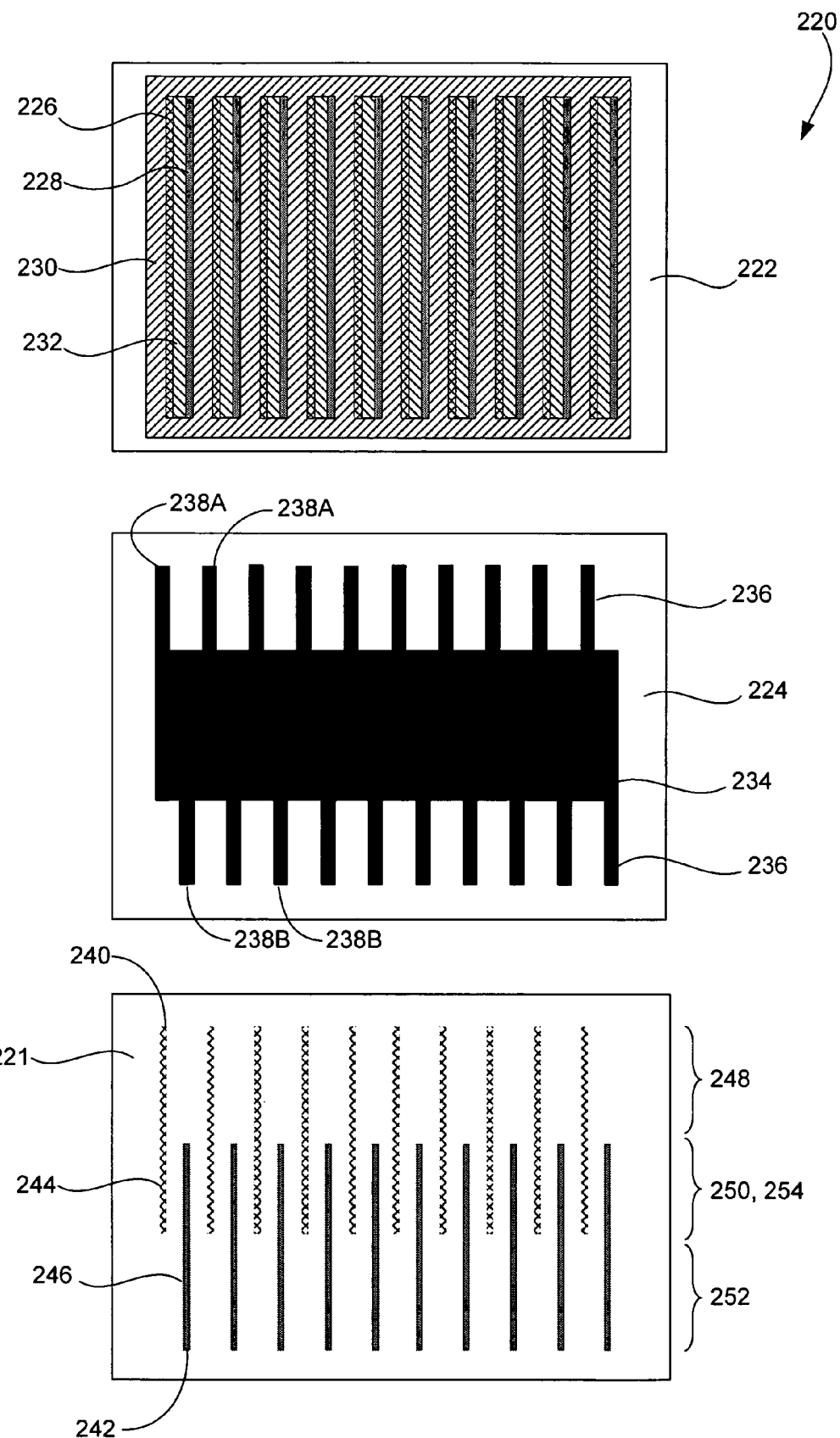
FIG. 12 is a top view of a focus masking system and a focus pattern, in accordance with one embodiment of the present invention.

In accordance with an alternate embodiment of the invention, the focus pattern may include periodic structures that are both interlaced and spaced apart. To facilitate discussion, FIG. 12 illustrates a top view of a focus masking system 220 capable of producing a focus pattern 221 with interlaced and spaced apart periodic structures. As shown, the focus masking system 220 includes a focus masking structure 222 and a trim masking structure 224. The focus masking structure 222 includes a plurality of parallel source lines 226 (shown by cross hatching) and 228 (shown by shading), which are separated by alternating phase shift zones 230 and 232. The focus masking structure 222 may be widely varied. In the illustrated embodiment, the focus masking structure 222 corresponds to the focus masking structure shown in FIG. 4. The trim masking structure 224, on the other hand, includes a first masking element 234 for producing the interlaced periodic structures and a second masking element 236 for producing spaced apart periodic structures.

As shown, the first masking element 234 is configured to cover a substantial portion of the initial focus pattern produced by the focus masking structure, as for example the printed lines 86 and 90 of FIG. 6. In the illustrated embodiment, the first masking element covers a middle portion of all of the printed lines 86 and 90. Furthermore, the second masking element 236 includes a plurality of masking lines 238 that extend from the first masking element 234. The masking lines 238 are configured to cover individual printed lines of the initial focus pattern. In the illustrated embodiment, a first set of masking lines 238A extends from a top portion of the first masking element 234 while a second set of masking lines 238B extends from a bottom portion of the first masking element 234. The first set of masking lines 238A is arranged to cover an upper portion of a first group of printed lines while the second set of masking lines is arranged to cover a lower portion of a second group of printed lines. In the illustrated embodiment, the first group of printed lines corresponds to the printed lines 86 while the second group of printed lines corresponds to the printed lines 90.

Referring now to the focus pattern 221, the focus pattern 221 includes a first periodic structure 240 having a plurality of coarsely segmented lines 244 and a second periodic structure 242 having a plurality of coarsely segmented lines 246. The first periodic structure 240 includes a spaced apart portion 248 and an interlaced portion 250. In a similar fashion, the second periodic structure 242 includes a spaced apart portion 252 and an interlaced portion 254. As shown, the interlaced portion 250 of the first periodic structure 240 is interlaced with the interlaced portion 254 of the second periodic structure 242 such that their printed lines alternate along an axis. Furthermore, the spaced apart portion 248 of the first periodic structure 240 is spaced apart from the spaced apart portion 252 of the second periodic structure 242.

Figure 13:
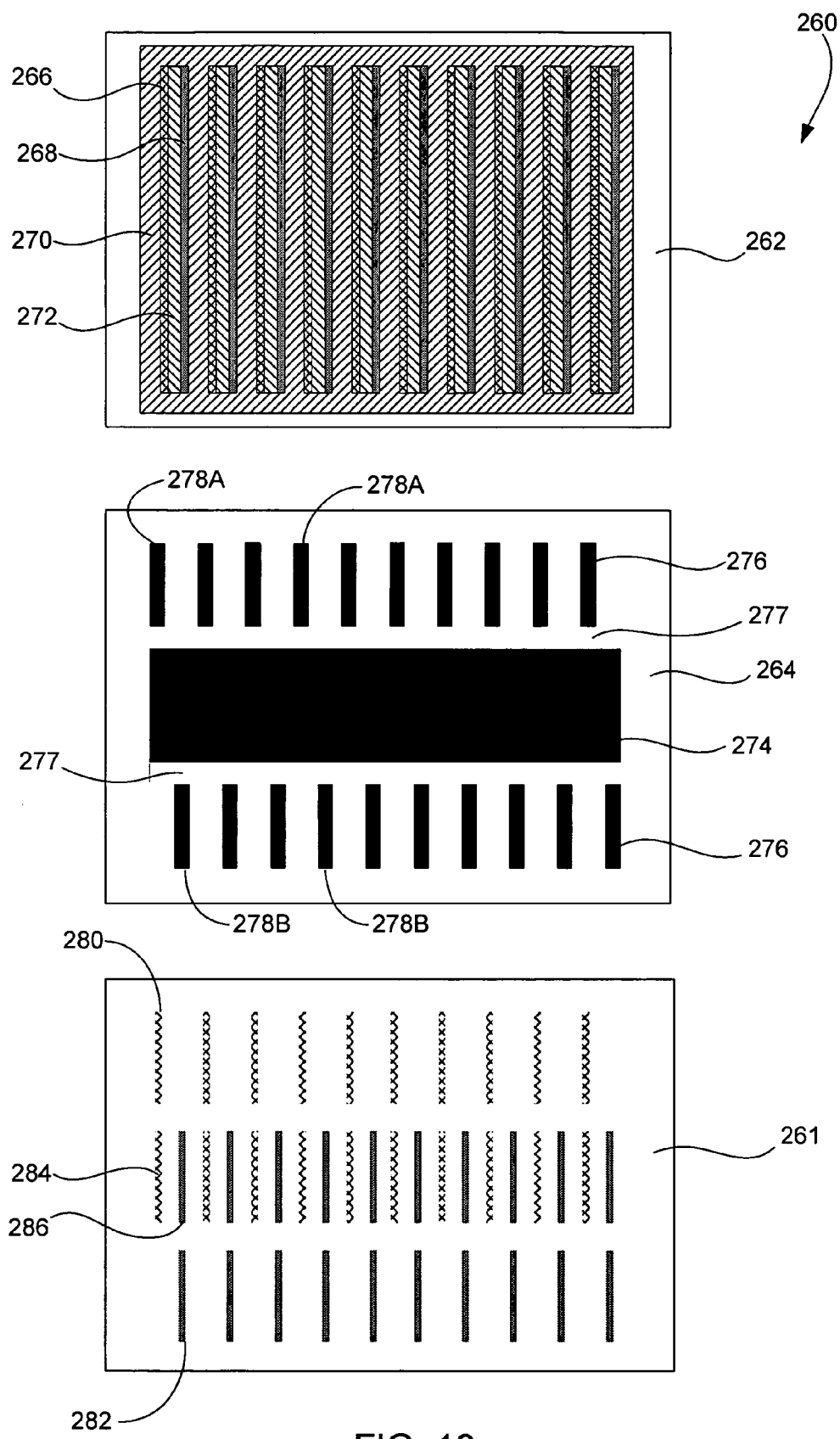
FIG. 13 is a top view of a focus masking system and a focus pattern, in accordance with one embodiment of the present invention.
Figure 14A:
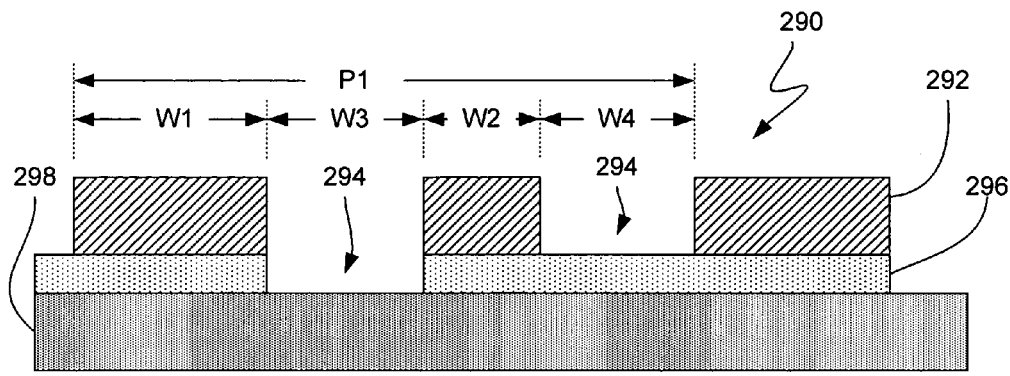
FIGS. 14A–14K are side views showing various embodiments of a focus masking structure with weak phase shifting components, in accordance with one embodiment of the present invention.
Figure 14B:
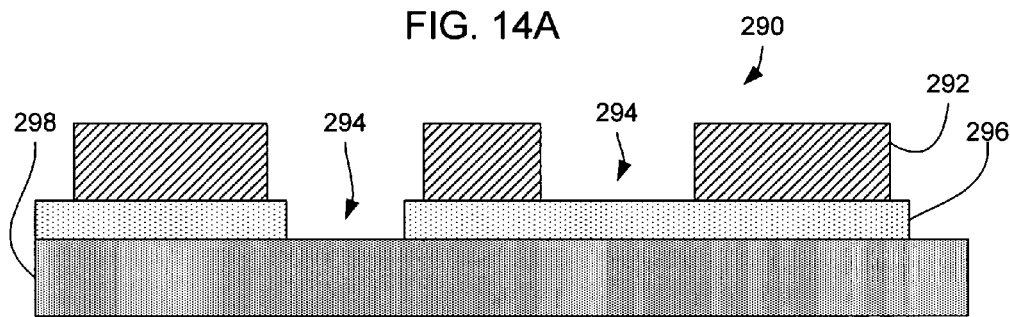
Figure 14C:
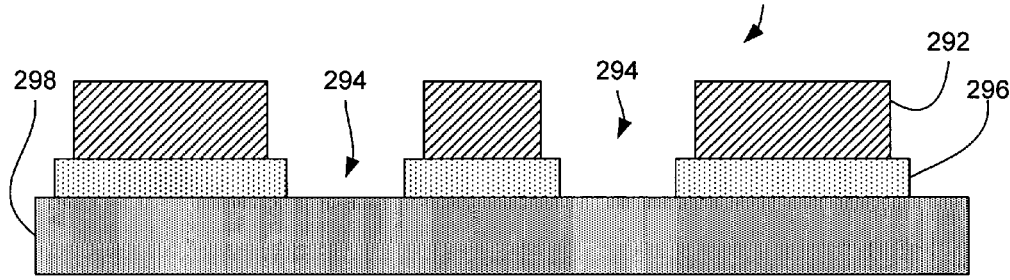
Figure 14D:
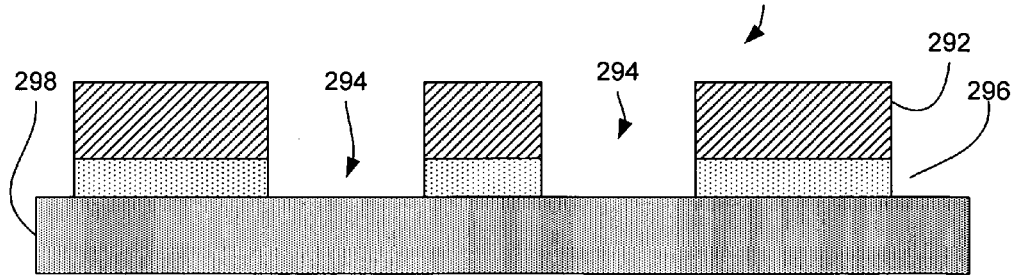
Figure 14E:
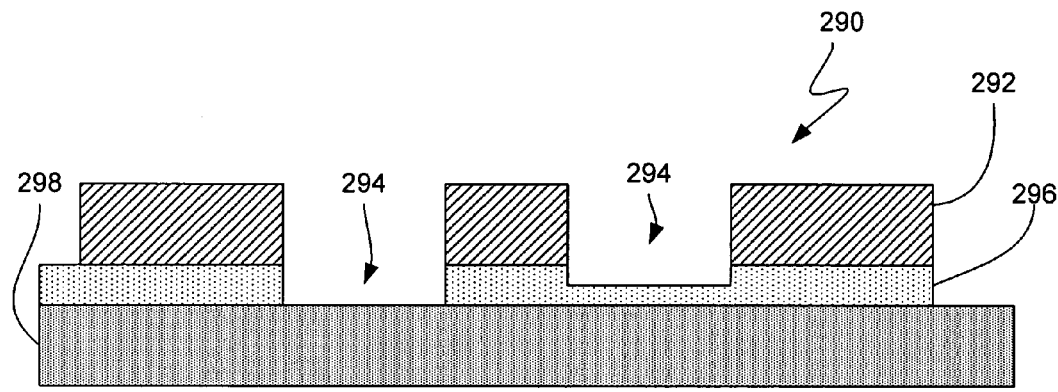
Figure 14F:
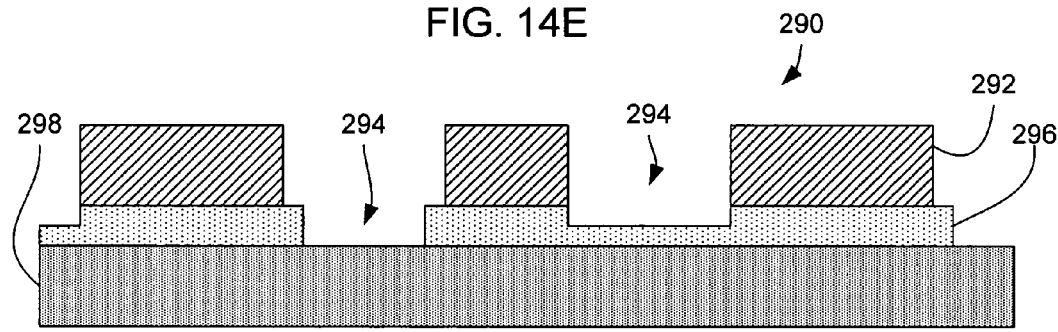
Figure 14G:
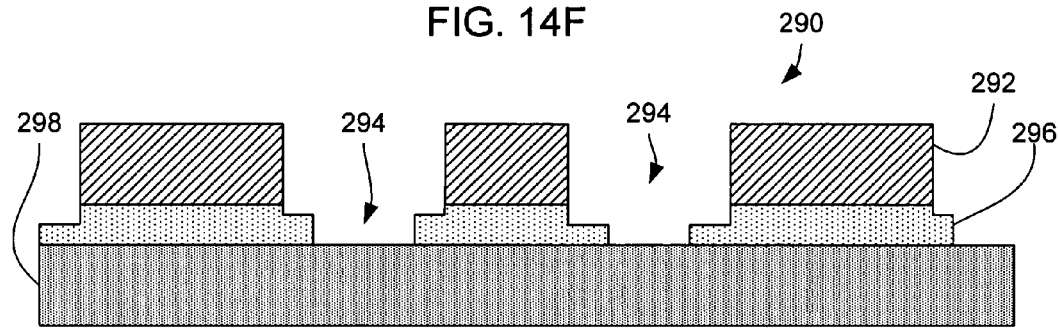
Figure 14H:
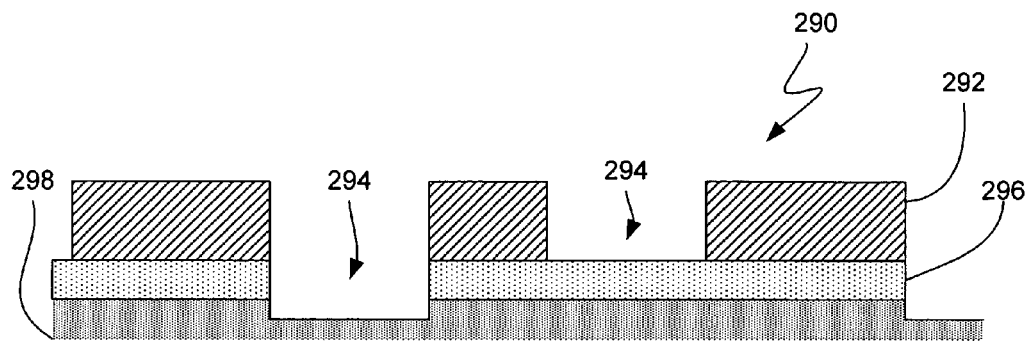
Figure 14I:
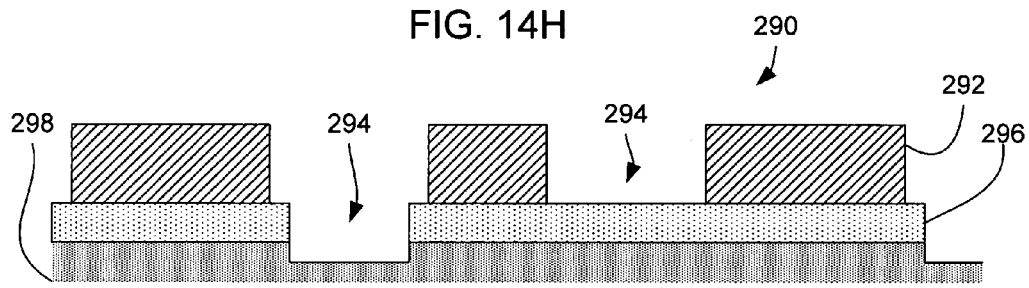
Figure 14J:
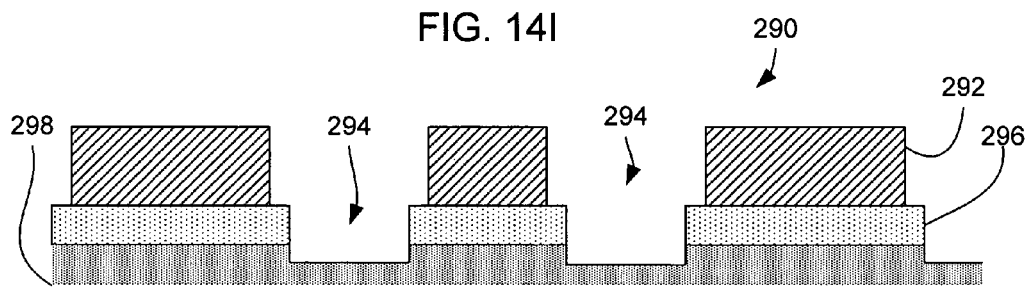
Figure 14K:
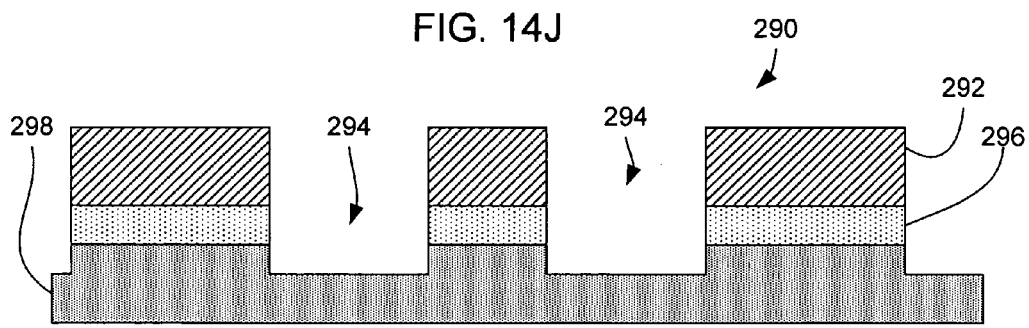

In an alternate embodiment, the spaced apart portions of the first and second periodic structures may be separated from the interlaced portions. This is generally accomplished by separating the second masking element from the first masking element of the trim masking structure. By way of example, FIG. 13 illustrates a top view of a focus masking system 260 capable of producing a focus pattern 261 with interlaced periodic structures that are separated from spaced apart periodic structures.

As shown, the focus masking system 260 includes a focus masking structure 262 and a trim masking structure 264. The focus masking structure 262 includes a plurality of parallel source lines 266 (shown by cross hatching) and 268 (shown by shading), which are separated by alternating phase shift zones 270 and 272. The focus masking structure 262 may be widely varied. In the illustrated embodiment, the focus masking structure 262 corresponds to the focus masking structure shown in FIG. 4. The trim masking structure 264, on the other hand, includes a first masking element 274 for producing the interlaced periodic structures and a second masking element 276 for producing spaced apart periodic structures. The first masking element 274 is spaced apart from the second masking elements 276 such that there is a gap 277 therebetween. The gap 277 may be widely varied to meet specific requirements.

As shown, the first masking element 274 is configured to cover a substantial portion of the initial focus pattern produced by the focus masking structure, as for example the printed lines 86 and 90 of FIG. 6. In the illustrated embodiment, the first masking element covers a middle portion of all of the printed lines 86 and 90. Furthermore, the second masking element 276 includes a plurality of masking lines 278 that are configured to cover individual printed lines of the initial focus pattern. In the illustrated embodiment, a first set of masking lines 278A is arranged to cover an upper portion of a first group of printed lines while a second set of masking lines 278B is arranged to cover a lower portion of a second group of printed lines. In the illustrated embodiment, the first group of printed lines corresponds to the printed lines 86 while the second group of printed lines corresponds to the printed lines 90. With regards to the focus pattern 261, the focus pattern 261 includes spaced apart periodic structures 280 and 282 and interlaced periodic structures 284 and 286. Each of the periodic structures 280-286 includes a plurality of coarsely segmented lines.

In accordance with an alternate embodiment of the invention, the focus masking structure can be designed to incorporate partially transmitting materials in addition to mostly opaque and transparent materials. Phase shift masks that incorporate partially transmitting materials are sometimes referred to as weak phase shift masks, attenuated phase shift masks, or tri-tone phase shift masks. Partially transmitting materials generally have a transmission or attenuation associated therewith that can effect the phase shift of the phase shift zones. In most cases, the partially transmitting material is disposed between a substrate and the source lines of the focus masking structure. The partially transmitting material may be widely modified. For example, the material properties, widths, thickness and/or position of the partially transmitting material may be adjusted to produce the desired phase shifts for each of the phase shift zones in the focus masking structure. The partially transmitting materials may also cooperate with other phase shifting techniques to produce the desired phase shifts. For example, the partially transmitting material may be used along with openings etched into the substrate.

To facilitate discussion FIGS. 14A to 14K show various embodiments of a focus masking structure with weak phase shifting components. Similar to the embodiments shown above, the focus masking structures 290 of FIGS. 14A to 14K include a plurality of source lines 292 separated by alternating phase shift zones 294. However, unlike the preceding embodiments, in FIGS. 14A to 14K, the phase shift of the phase shift zones are altered by the addition of an attenuating phase shifter 296. As shown, the attenuating phase shifter 296 is disposed on or above the substrate 298, and the source lines 292 are disposed on or above the attenuating phase shifter 296. In most cases, the source lines 292 are formed from chrome, however, other opaque (or nearly opaque materials) may be used. The attenuating phase shifter 296, on the other hand, is generally formed from a partially transmissive material. The configuration of the attenuating phase shifter may be widely varied to produce phase shift zones with different phases.

In accordance with an alternate embodiment of the invention, finely segmented elements may be used to form the coarsely segmented printed lines of the periodic structures of the focus pattern. Finely segmented elements allow the focus pattern to facilitate focus measurements that more accurately represent the degree of misfocus. That is, the finely segmented elements serve to provide focus information that more closely matches the focus used to form the integrated circuits. Each of these finely segmented elements are about the same size and separation as structures of the actual integrated circuits. By forming each of the periodic structures with sub-structures that are sized closer to the size of the actual circuits, a more accurate measurement of any focus error in such circuits is obtained.

The configuration of the finely segmented elements may be widely varied.

For example, the finely segmented elements may be composed of lines, squares, rectangles, triangles, polygons, circles, ovals, arbitrary shapes and the like. As should be appreciated, the finely segmented elements may not have perfectly symmetrical shapes since they are typically formed via lithographic and pattern transfer processes.

In addition, the periodic structures of the focus pattern may or may not contain the same form or finely segmented elements. For example, one periodic structure may contain linearly shaped elements while a different periodic structure may contain circularly shaped elements. In addition, one periodic structure may contain circularly shaped elements and a different periodic structure may contain square shaped elements. Moreover, one periodic structure may contain linearly shaped elements and a different periodic structure may contain square shaped elements. Even further variations include some periodic structures, which are composed of finely segmented elements and others, which are not composed of finely segmented elements, but rather single solid lines.

Moreover, individual periodic structures may or may not contain the same form or finely segmented elements. For example, a single periodic structure may include one coarsely segmented line that is formed by linearly shaped elements and another coarsely segmented line that is formed by square shaped elements.

Representative configurations that may used in focus patterns may be found in co-pending patent application Ser. No. 09/654,318, titled "IMPROVED OVERLAY ALIGNMENT MEASUREMENT MARK," filed on Sep. 1, 2000, and U.S. patent application Ser. No. 09/894,987, titled "OVERLAY MARKS, METHODS OF OVERLAY MARK DESIGN AND METHODS OF OVERLAY MEASUREMENTS," filed on Jun. 27, 2001, both of which are herein incorporated by reference.

Figure 15:
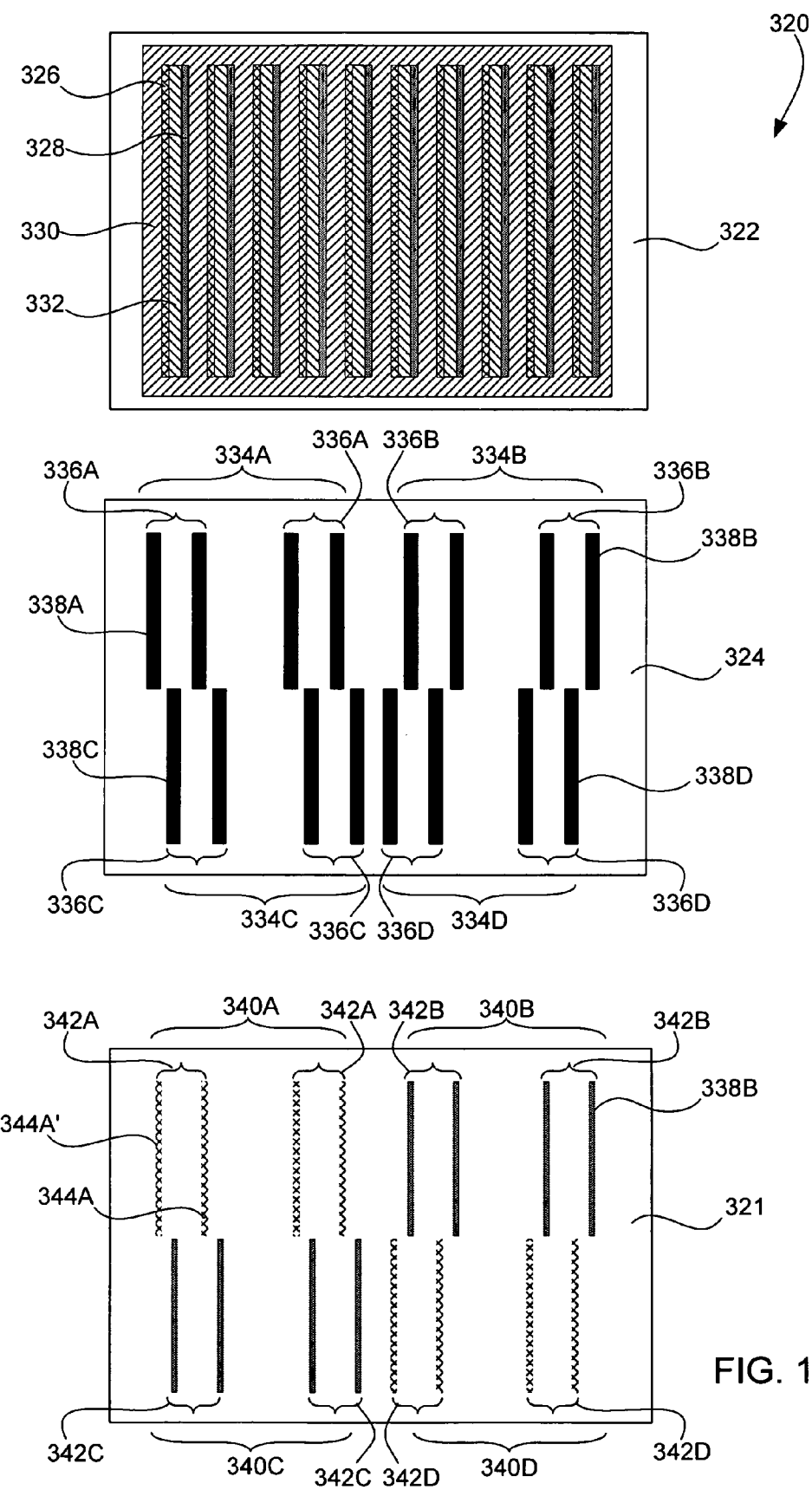
FIG. 15 illustrates a focus masking system that may be used to produce focus pattern with finely segmented elements, in accordance with one embodiment of the present invention.

To facilitate discussion, FIG. 15 illustrates a focus masking system 320 that may be used to produce a focus pattern 321 with finely segmented elements. Although the components of this system appear to be similar to the components described above, it should be noted that this is an enlarged view and that the individual lines represent finely segmented elements rather than coarsely segmented lines. As shown, the focus masking system includes a focus masking structure 322 and a trim masking structure 324. The focus masking structure 322 includes a plurality of source lines 326, 328 separated by alternating phase shift zones 330, 332. The trim masking structure 324 includes a plurality masking zones 334 having masking elements 336 configured to cover portions of the printed lines of the initial focus pattern produced by the focus masking structure 322. The focus pattern 321 includes a plurality of periodic structures 340 having coarsely segmented printed lines 342 that are formed by a plurality of finely segmented lines 344.

The focus and trim masking structures 322, 324 may be widely varied to produce the desired focus pattern 321. For example, the focus and trim masking structures may be designed to produce a focus pattern with a certain number of periodic structures, coarsely segmented lines and finely segmented lines. Furthermore, the focus and trim masking structures may designed to produce a specific configuration such as interlaced periodic structures or spatially separated periodic structures.

In general, the trim masking structure 324 includes a plurality of masking zones 334 so as to produce a plurality of periodic structures 340. Each of the masking zones 334 includes a plurality of masking elements 336 so as to produce a plurality of coarsely segmented lines 342. Furthermore, each of the masking elements 336 includes a plurality of masking lines 338 so as to produce the plurality of finely segmented lines 344. The configuration of these components may be widely varied. In the illustrated embodiment, the trim masking structure 324 includes four spaced apart masking zones 334A–D that produce four periodic structures 340A–D that are spatially distinct. Each of the masking zones 334A–D includes two masking elements 336A–D so as to produce two coarsely segmented lines 342A–D, and each of the masking elements 336A–D includes two masking lines 338A–D so as to produce two finely segmented lines 344A–D. It should be noted that this configuration is not a limitation and is shown simplified for ease of discussion. For example, it is generally preferred to have more than two coarsely segmented lines, and more than two finely segmented lines. It is generally believed that the greater number of lines produces a better focus information.

In most cases, the dimensions of the coarsely segmented lines of FIG. 15 correspond to the dimensions of the printed lines shown in FIG. 6. The width of the coarsely segmented lines generally range between about 0.2 to about 2.0, and the line spacing therebetween generally ranges between about 0.2 to about 2.0. The finely segmented lines, on the other hand, generally have widths that range between about 0.01 um and about 0.25 um, and spacings that range between about 0.1 and about 2.

In most cases, the coarsely segmented lines widths are generally 3 to 50 times the widths of the finely segmented lines.

Figure 16:
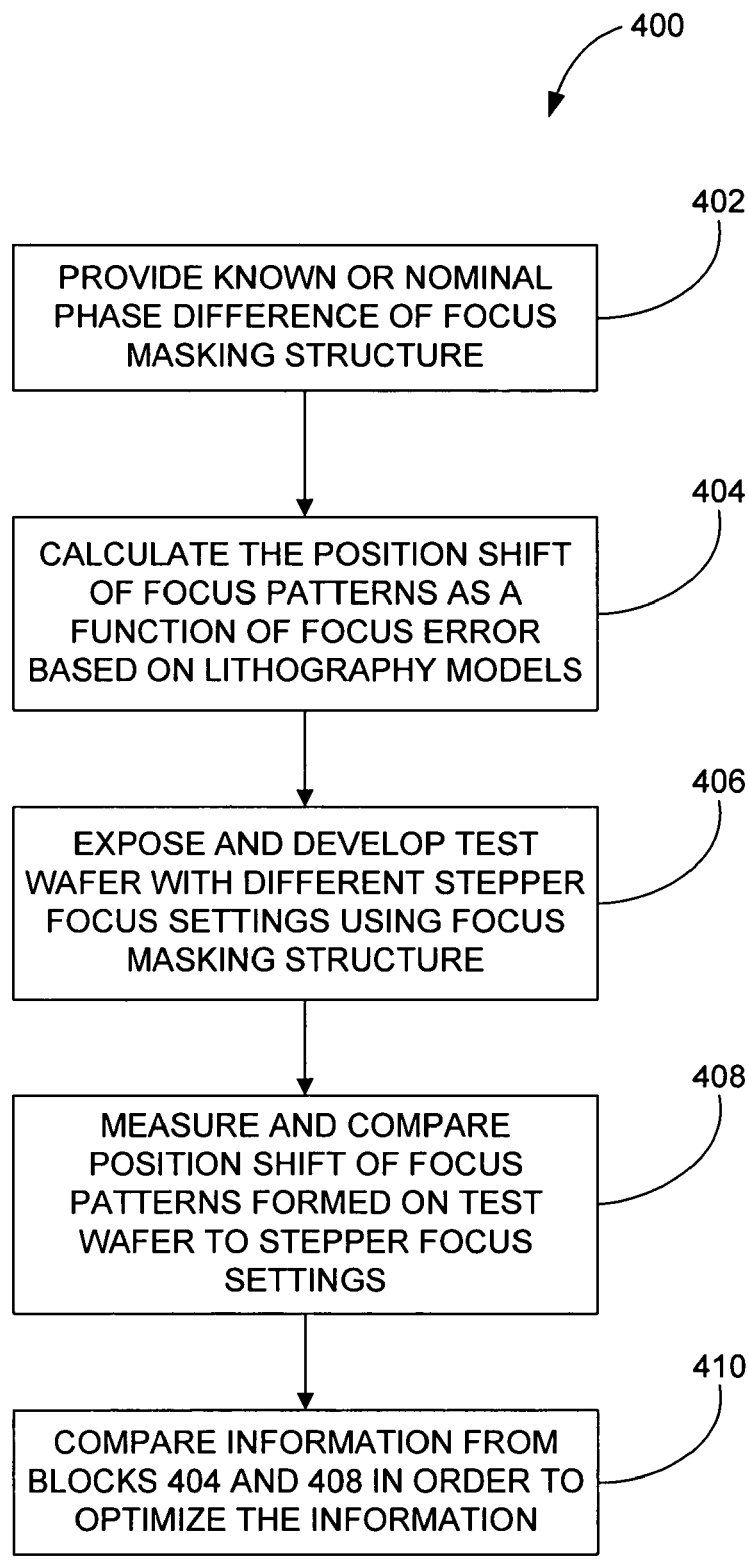
FIG. 16 is a flow diagram of a focus calibration procedure, in accordance with one embodiment of the present invention.

FIG. 16 is a flow diagram of a focus calibration procedure 400, in accordance with one embodiment of the present invention. The process 400 generally begins at block 402 where a known or nominal phase difference Ph1–Ph2 of a focus masking structure is provided. The phase difference Ph1–Ph2 may be measured using a separate measurement technique or it may be supplied by the phase shift mask manufacturer. Following block 402, the process flow proceeds to block 404 where the position shift of the focus patterns of the focus masking structure as a function of focus error is calculated based on lithography models (e.g., position shifts that are due to different focus errors). This data may be used for example to form a first calibration curve. Following block 404, the process flow proceeds to block 406 where one or more test wafers are exposed and developed with different stepper focus settings using the focus masking structure. That is, different fields and/or different resist coated wafers are exposed with different focus settings. After exposure the wafers are processed to develop the pattern in the exposed resist. Following block 406, the process flow proceeds to block 408 where the position shift of the focus patterns formed on the test wafer are measured and compared to the stepper focus settings. This data may be used for example to form a second calibration curve (e.g., empirical calibration curve). Following block 408, the process flow proceeds to an optimizing block 410 where the data from block 404 is compared with the data from block 408. This information may be used for example to form a third optimized calibration curve.

Figure 17:
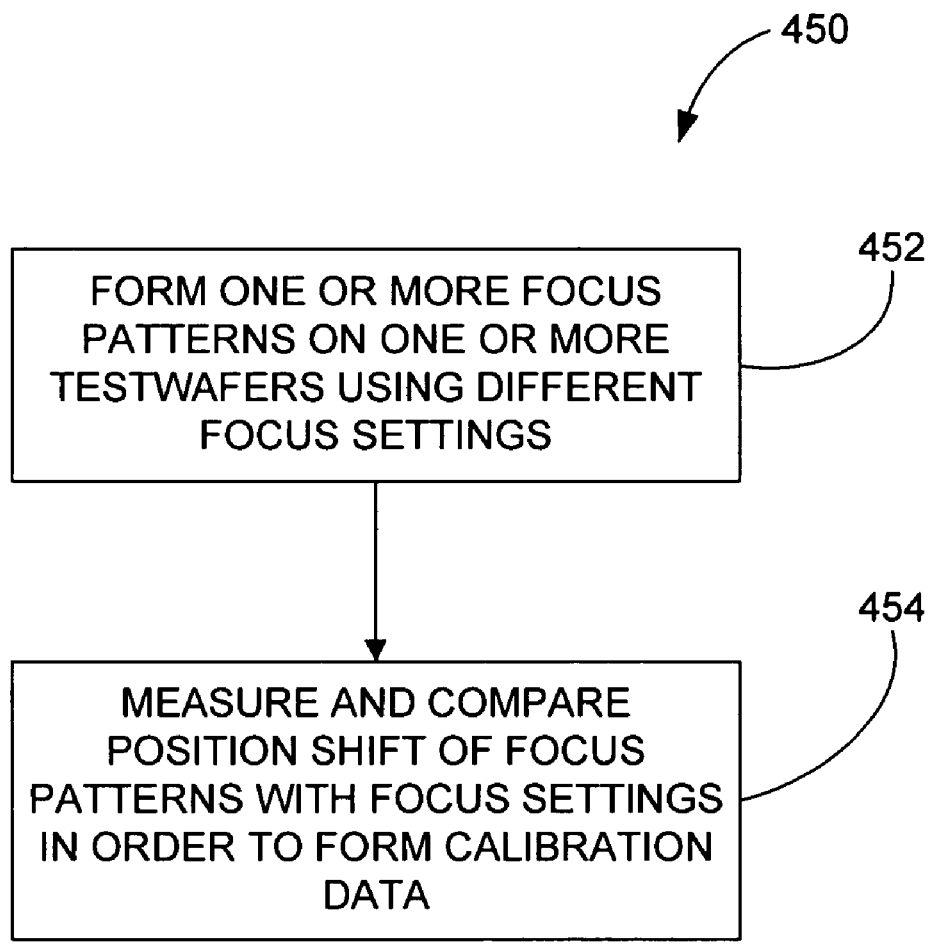
FIG. 17 is a flow diagram of a calibration procedure, in accordance with one embodiment of the present invention.
Figure 18:
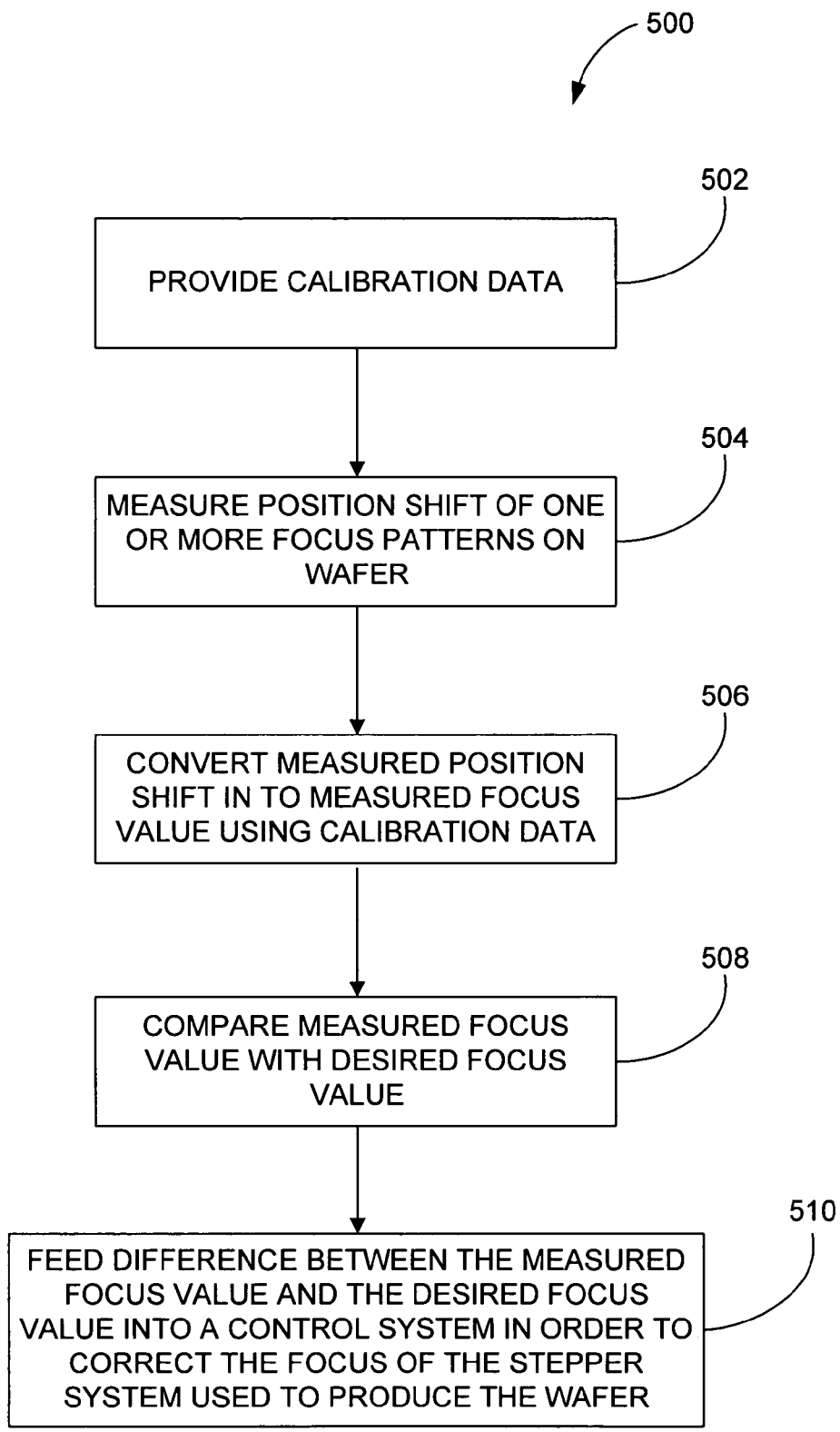
FIG. 18 is a flow diagram of a focus monitoring procedure, in accordance with one embodiment of the present invention.

FIG. 17 is a flow diagram of a calibration procedure 450, in accordance with one embodiment of the present invention. The process 450 generally begins at block 452 where one or more focus patterns are formed on one or more test wafers using different focus settings. After block 452, the process flow proceeds to block 454 where the position shift of the focus patterns are measured and compared with the focus settings in order to form calibration data. The calibration data may be used in subsequent processes to determine the focus value of a stepper system (see. FIG. 18). By way of example, the shifts of the focus patterns may be analyzed as a function of nominal stepper focus (or the stepper focus measured by another calibrated method) to determine the calibration of the focus pattern shifts vs. stepper focus. For example, the slope or linear fit to the plot of focus pattern shift vs. stepper focus may be used to calculate the stepper correction given a measured focus pattern shift and a known focus pattern shift corresponding to the condition required for best device performance. The slope of the focus pattern shift vs. stepper focus can also be analyzed using lithography modeling techniques to determine the phase difference Ph1–Ph2 for the focus masking region.

FIG. 18 is a flow diagram of a focus monitoring procedure 500, in accordance with one embodiment of the present invention. The process 500 generally begins at block 502 where calibration data is provided. By way of example, the calibration data may be formed using the method described in FIG. 17. Following block 502, the process flow proceeds to block 504 where the position shift of one or more focus patterns on a wafer, as for example, a production wafer, is measured. Following block 504, the process flow proceeds to block 506 where the measured position shift of the focus pattern is converted into a measured focus value using the calibration data. Following block 506, the process flow proceeds to block 508 where the measured focus value is compared with the desired focus value. Following block 508, the process flow proceeds to block 510 where the difference between the measured focus value and the desired focus value are fed into a control system in order to correct the focus of the stepper system used to produce the production wafer.

With regards to FIGS. 16–18, it may be necessary to calibrate the focus masking structures on each mask separately to account for variation in the manufacture of the masks or variation of the manufacture of the focus masking structure. It may also be necessary to determine the value of the focus measurement (determined from measurements of the focus pattern) which yields the best device performance, best predicted device performance, or acceptable range of predicted device performance. The focus control system would then be set up to maintain focus at best focus for device performance or within a range of acceptable device performance. The best focus for device performance may be determined with lithography and/or device modeling or with measurements of device structures that have known correlations to device performance (for instance resist line width, transistor gate speed, electrical test parameters, etc.) for device structures that have been created with a known variation of focus conditions. The device structures may be measured at different stages in the device manufacturing process including incomplete, non-functional devices with developed resist patterns or etched device features to completed functional devices.

While this invention has been described in terms of several preferred embodiments, there are alterations, permutations, and equivalents, which fall within the scope of this invention. For example, although the focus masking system was described in terms of producing a shift in the X direction, it should be noted that this is not a limitation and the focus masking system may also be configured to produce shifts in the Y direction or at some other angle in the X and Y plane. Furthermore, a single direction is not a limitation. For example, the focus masking system may be configured to produce shifts in multiple directions, as for example in the X and Y directions. This may be accomplished using multiple focus masking systems or using a single focus masking system with structures that are positioned in multiple directions, as for example 90 degrees from the other. Moreover, with regards to spatially separated periodic structures, it should be noted the "X" configuration is shown by way of example and not by way of limitation, i.e., the size, shape and distribution of the periodic structures may vary according to the specific needs of each mark. Examples of other patterns, as well as patterns that have both X and Y components, may be found in co-pending U.S. patent application Ser. No. 09/894,987, titled "OVERLAY MARKS, METHODS OF OVERLAY MARK DESIGN AND METHODS OF OVERLAY MEASUREMENTS," filed on Jun. 27, 2001, which is herein incorporated by reference.

In addition, the masking structure may be configured to produce a focus pattern that partially shifts, i.e., one of the periodic structures moves laterally with changes in focus while another one of the periodic structures does not move laterally with changes in focus (remains stationary). This embodiment may or may not require multiple masking and exposure steps to correctly generate the correct exposed pattern for a layer. Furthermore, the measurement of this type of focus pattern may be conducted in a similar manner as above by measuring the relative displacement between the shifted structure and the non-shifted structure.

Moreover, although it has been described herein that the effective phase difference is effected by the thickness and index of refraction of the phase shift zones, it should be noted that the width of the phase shift zones, the surface properties of the phase shift zones, and the like may also effect the phase shift zones in a non-trivial manner. These types of parameters may be used to correct or compensate the phase of the phase shift zones or they may be used to induce a desired phase of the phase shift zones.

Figure 19A:
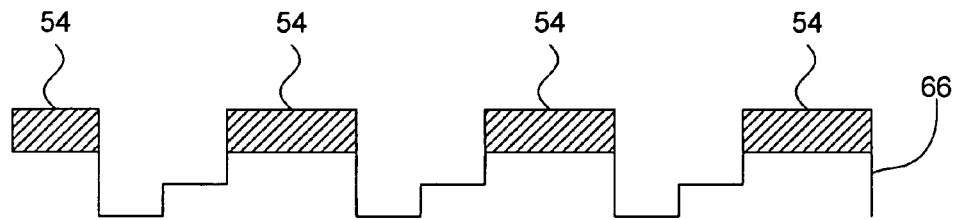
FIGS. 19A–19D are broken away side views, in cross section, of various focus masking structures, in accordance with one embodiment of the invention.
Figure 19B:
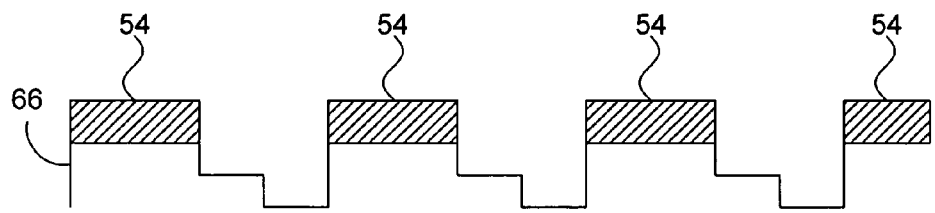
Figure 19C:
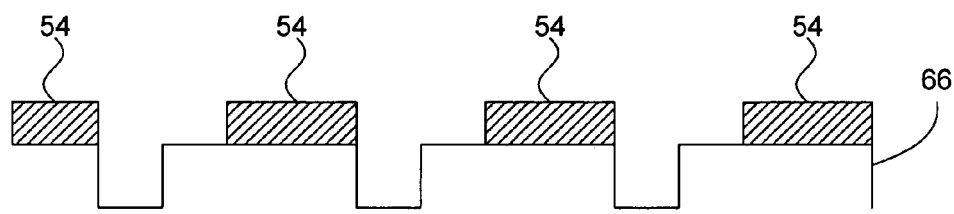
Figure 19D:
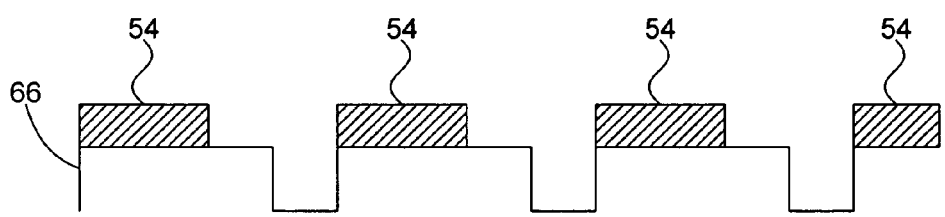

It should also be noted that sources (source lines) may be formed from other materials besides metals. For example, the source lines may also be formed from a portion of the substrate or from other light effecting materials (e.g., chromeless phase shift mask). FIGS. 19A–D show various examples of focus masking structures where the chrome width of one or more of the source lines is zero. For ease of explanation, these Figures are variations of FIG. 5. These examples can also be considered a combination of a chromeless alternating phase shift mask (for one phase transition, e.g. Ph1 to Ph2 from left to right) and a conventional chrome-based alternating phase shift mask (for the other phase transition, e.g. Ph2 to Ph1). Alternatively, the chrome width may be non-zero but smaller than the minimum width required to print a line or feature on the developed wafer. Referring to FIG. 19A, the line width corresponding to width 56 in FIG. 5 is zero. Referring to 19B, the line width corresponding to width 54 in FIG. 5 is zero. Referring to 19C, the line width corresponding to width 56 in FIG. 5 is zero (here Ph1 is equal to Phs). Referring to 19D, the line width corresponding to width 54 in FIG. 5 is zero (here Ph1 is equal to Phs).

The focus masking structure may also be constructed with combinations of regions with different widths, for instance a focus masking structure similar in layout to 162 in FIG. 10 may be constructed with the quadrants 168A and 168D with one structure with characteristic widths and 168B and 168C with a different structure with different feature widths. For instance, the width of the chrome line for the Ph1 to Ph2 transition may be (or small) for quadrants 168A and 168D and the width of the Ph2 to Ph1 transition may be zero (or small) for quadrants 168B and 168C. In the case where the zero (or small width) transition does not print on the developed wafer, the developed focus pattern will have lines corresponding to the Ph2 to Ph1 transition in quadrants corresponding 180A and 180D and lines corresponding to the Ph1 to Ph2 transition in quadrants corresponding 180B and 180C. In this case a trim mask 164 and corresponding second exposure is not required. These lines will move in opposite directions thus the relative position will depend in part on the sign and magnitude of the stepper focus error. The resulting focus pattern can be measured with scanning, imaging, or phase-based measurement techniques described elsewhere in this patent.

It should also be noted that there are many alternative ways of implementing the methods and apparatuses of the present invention. For example, detailed analysis of focus errors at multiple locations in the stepper image plane (stepper field on the wafer) can be used to determine the optical aberrations of the photolithography system. Optical aberrations in the stepper lens system can alter the intensity and/or the phase of the radiation differently at different locations in the image plane or differently for different feature pitches or widths. Methods of analyzing multiple focus error measurements to derive the optical aberrations of the stepper lens system are well known to those skilled in the art. Optical aberrations may be described in terms of the Zernike coefficients. Zernike coefficients are described in greater detail in References: *Principles of Optics*, 6$^{th}$ edition, Max Born and Emil Wolf, Permagon Press, 1980; *Handbook of Optics*, Vol. 1, p 1.98, Optical Society of America, McGraw Hill, 1995, and *Handbook of Optics* Vol. 3, p 1.12–1.15, Optical Society of America, McGraw Hill, 2001, all of which are herein incorporated by reference. Optical aberrations can be described with other methods understood by those skilled in the art. Alternatively, the shape information from either or both sets of the printed lines can be analyzed to determine the optical aberrations of the stepper. One important feature is that some lines were created with PH1–Ph2 transitions and other lines were created with Ph2–Ph1 transitions. The patterns produced by different transitions are affected differently by optical aberrations. That is, the lines from different phase shift groups (Ph1 to Ph2) and (Ph2 to Ph1) may have different characteristic shapes, wall angles, rounding, asymmetric tilts, etc. that may change with focus.

As mentioned above, the use of multiple measurements of the focus masking structure may be used to determine the aberrations of a stepper lens system. The stepper lens aberration information obtained with this method may be used to qualify a stepper for production. The stepper lens aberration information obtained with this method may be used to determine the best stepper to use for lithographic patterning of certain critical device features. The stepper lens aberration information obtained with this method may be used to determine the stepper overlay matching. The stepper lens aberration information obtained with this method may be used to determine the stepper control settings to improve the device overlay. The stepper lens aberration information obtained with this method may be used to determine the stepper control settings to improve the device line width characteristics. The stepper lens aberration information obtained with this method may be used to repair, rework, or minimize the effects of stepper lens aberrations. The stepper lens aberration information obtained with this method may be used to determine the stepper control settings to correct for wafer tilt.

The use of multiple focus measurements within a field may also be used to determine the stepper control settings to correct for mask tilt. The use of multiple focus measurements within a field may also be used to determine the stepper control settings to correct for wafer tilt. The use of multiple focus measurements within a field may also be used to determine the stepper control settings to correct for wafer stage tilt. The use of multiple focus measurements within a field may also be used to determine the effects of wafer topography on local pattern focus. The wafer topography information obtained in this manner may be used to optimize device design and layout to reduce the topography variation within the device or stepper field.

It is therefore intended that the following appended claims be interpreted as including all such alterations, permutations, and equivalents as fall within the true spirit and scope of the present invention.

What is claimed is:

1. A focus masking structure used to determine the focus quality of a photolithographic pattern or a photolithographic system, said focus masking structure being disposed on a substrate, said focus masking structure comprising:

a plurality of parallel source lines; and a plurality of phase shift zones configured to separate said plurality of parallel source lines, said plurality of phase shift zones alternating between a first phase shift zone and a second phase shift zone, said first phase shift zone having a phase substantially equal to the substrate, and a phase difference between the first and second phase shift zones that is not equal to 0 or 180 degrees or integer multiples of 180 degrees, wherein said plurality of parallel source lines and said phase shift zones cooperate to produce a focus pattern that includes at least two periodic structures that shift relative to one another with changes in focus, said shift being based on the sign and magnitude of defocus and the sign and magnitude of the phase difference.

2. The focus masking structure as recited in claim 1 wherein said focus masking structure produces a focus pattern having periodic structures that are interlaced with each other.

3. The focus masking structure as recited in claim 1 wherein said focus masking structure produces a focus pattern having periodic structures that are spatially separated from one another.

4. The focus masking structure as recited in claim 1 wherein said focus masking structure produces a focus pattern having periodic structures that are partially interlaced and partially separated from one other.

* * * * *